United States Patent
Shimai et al.

(10) Patent No.: US 9,010,270 B2
(45) Date of Patent: Apr. 21, 2015

(54) COATING DEVICE INCLUDING SUBSTRATE CARRYING, APPLICATION AND REMOVAL UNITS

(75) Inventors: Futoshi Shimai, Kawasaki (JP); Akihiko Sato, Kawasaki (JP); Tsutomu Sahoda, Kawasaki (JP); Kenji Maruyama, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 93 days.

(21) Appl. No.: 13/116,941

(22) Filed: May 26, 2011

(65) Prior Publication Data
US 2011/0290178 A1 Dec. 1, 2011

(30) Foreign Application Priority Data
May 28, 2010 (JP) ................................. 2010-123193

(51) Int. Cl.
B05C 5/00 (2006.01)
B05D 3/00 (2006.01)
H01L 21/67 (2006.01)
H01L 21/677 (2006.01)
B05C 5/02 (2006.01)
B05C 9/04 (2006.01)
(Continued)

(52) U.S. Cl.
CPC ... B05C 5/02 (2013.01); B05C 9/04 (2013.01); B05D 3/007 (2013.01); H01L 21/67155 (2013.01); B05B 13/0228 (2013.01); B05B 13/02 (2013.01); H01L 21/67051 (2013.01); B05B 13/0278 (2013.01); B05D 1/002 (2013.01); B05D 1/26 (2013.01); G11B 5/842 (2013.01)

(58) Field of Classification Search
USPC .......... 118/52, 56, 75; 134/153, 198, 902, 34, 134/78, 79, 80, 104.2, 104.3, 104.4
See application file for complete search history.

(56) References Cited

U.S. PATENT DOCUMENTS 5,688,411 A 11/1997 Kutsuzawa et al.
5,939,139 A 8/1999 Fujimoto
(Continued)

FOREIGN PATENT DOCUMENTS

JP 60-54763 A 3/1985
JP A H04-283420 10/1992
JP A-2004-261705 9/2004

OTHER PUBLICATIONS 18230462 061714.
(Continued)

*Primary Examiner* — Dah-Wei D Yuan
*Assistant Examiner* — Binu Thomas
(74) *Attorney, Agent, or Firm* — Knobbe Martens Olson & Bear LLP

(57) ABSTRACT

Provided is a coating device including: a substrate carrying unit which rotatably holds a substrate while the substrate is upright and is able to dispose the held substrate at a first position and a second position; an application unit which includes a liquid material nozzle ejecting a liquid material to each of first and second surfaces of the substrate disposed at the first position; and a removal unit which includes an accommodation mechanism accommodating a part of the peripheral edge portion of the substrate disposed at the second position and a cleaning liquid ejection mechanism ejecting a cleaning liquid to the peripheral edge portion and removes the liquid material of the peripheral edge portion.

9 Claims, 14 Drawing Sheets

(51) Int. Cl.
   *B05B 13/02*   (2006.01)
   *B05D 1/00*    (2006.01)
   *B05D 1/26*    (2006.01)
   *G11B 5/842*   (2006.01)

(56) References Cited

U.S. PATENT DOCUMENTS

| | | | |
|---|---|---|---|
| 6,106,618 A | 8/2000 | Gilmer et al. | |
| 6,238,511 B1 * | 5/2001 | Sada et al. | 134/172 |
| 6,797,074 B2 * | 9/2004 | Redeker et al. | 134/26 |
| 2003/0196683 A1 * | 10/2003 | Izumi et al. | 134/2 |
| 2005/0067100 A1 * | 3/2005 | Kobayashi et al. | 156/345.11 |
| 2010/0050940 A1 * | 3/2010 | Sahoda et al. | 118/72 |
| 2010/0297352 A1 * | 11/2010 | Sahoda et al. | 118/315 |

OTHER PUBLICATIONS

Office Action in U.S. Appl. No. 14/021,770, mailed Jan. 22, 2015.

* cited by examiner

COATING DEVICE INCLUDING SUBSTRATE CARRYING, APPLICATION AND REMOVAL UNITS

BACKGROUND OF THE INVENTION

1. Field of the Invention

The present invention relates to a coating device.

Priority is claimed on Japanese Patent Application No. 2010-123193, filed May 28, 2010, the content of which is incorporated herein by reference.

2. Description of Related Art

In a substrate processing system that forms a thin coating film such as a resist film on, for example, various substrates such as a semiconductor substrate, a glass substrate constituting a liquid panel, and a substrate constituting a hard disk, a coating device forming a coating film on the substrate while rotating the substrate has been used. Such a coating device generally adopts a configuration in which the substrate is laid down in parallel to the horizontal plane and the substrate rotates while the lower surface thereof is held.

On the other hand, in a substrate constituting a hard disk which needs to coat a liquid material on both surfaces of the substrate, the lower surface of the substrate may not be held. For this reason, as disclosed in JP-A-H04-283420, a configuration has been proposed in which the substrate is rotated while being held by a holding piece.

When the liquid material is applied to both surfaces of the substrate while the substrate is laid down, there is a concern that the application environment between the first and second surfaces of the substrate is different and the thin coating films formed thereon are different. Therefore, recently, there has been proposed a configuration in which the liquid material is applied to both surfaces of the substrate while the substrate is upright.

When the liquid material is applied to both surfaces of the substrate while the substrate is upright, for example, a method may be considered in which a substrate is accommodated in a vertical cup and a liquid material is ejected from a nozzle to the substrate while the substrate rotates. In this case, there is a concern that droplets of a liquid material are attached to the inside of the cup and are attached to the substrate. For this reason, in order to remove the droplets of the liquid material, the air inside the cup is appropriately ventilated.

Further, there is a case in which the liquid material is applied to the substrate and the liquid material is removed from a part of the peripheral edge portion of the substrate in the cup by the peripheral edge portion removal process. As an example of the peripheral edge portion removal process, a method may be considered which ejects a cleaning liquid from a nozzle to a part of the peripheral edge portion of the substrate while the substrate rotates. Even when this method is performed, there is a concern that the droplets of the removed liquid material or the removed cleaning liquid are attached to the inside of the cup or the substrate, the air inside the cup is appropriately ventilated.

[Patent Document 1] Japanese Unexamined Patent Application, First Publication No. H4-283420

SUMMARY OF THE INVENTION

However, in an application process and a peripheral edge portion removal process, for example, the optimal environment for the process such as the ventilation amount inside the cup is different. For this reason, when the application process and the peripheral edge portion removal process are performed at the same position, the environment inside the cup needs to be adjusted every time. Since it is not possible to perform the process with respect to the substrate while the environment is adjusted, the throughput is degraded.

The invention is made in view of such circumstances, and an object thereof is to provide a coating device capable of preventing a degradation of the throughput.

In order to attain the above-described object, according to an aspect of the invention, a coating device is provided including: a substrate carrying unit which rotatably holds a substrate while the substrate is upright and is able to dispose the held substrate at a first position and a second position; an application unit which includes a liquid material nozzle ejecting a liquid material to each of first and second surfaces of the substrate disposed at the first position; and a removal unit which includes an accommodation mechanism accommodating part of the peripheral edge portion of the substrate disposed at the second position and a cleaning liquid ejection mechanism ejecting a cleaning liquid to the peripheral edge portion and removes the liquid material of the peripheral edge portion.

According to the aspect of the invention, since the application unit is provided at the first position where the substrate is carried by the substrate carrying unit and the removal unit is provided at the second position, it is possible to independently set the process environments of the application unit and the removal unit. For this reason, it is not necessary to adjust the environment around the substrate for each process and to prevent a degradation of the throughput.

In the coating device, the removal unit may include a suction mechanism.

According to the aspect of the invention, since the removal unit includes the suction mechanism, it is possible to prevent scatter of the cleaning liquid or the removed liquid material. Accordingly, it is possible to prevent a change of the environment around the substrate in the removal unit.

In the coating device, the suction mechanism may include a suction port which is provided at the lower end portion of the substrate.

According to the aspect of the invention, since the suction mechanism includes the suction port which is provided at the lower end portion of the substrate, it is possible to prevent the rising of the cleaning liquid or the removed liquid material.

In the coating device, the cleaning liquid ejection mechanism may include a cleaning liquid nozzle which ejects the cleaning liquid.

According to the aspect of the invention, since the cleaning liquid ejection mechanism includes the cleaning liquid nozzle which ejects the cleaning liquid, it is possible to efficiently remove the liquid material attached to part of the peripheral edge portion of the substrate.

In the coating device, the cleaning liquid nozzle may be configured to eject the cleaning liquid from the center of the substrate toward the outer peripheral portion of the substrate.

According to the aspect of the invention, since the cleaning liquid nozzle is configured to eject the cleaning liquid from the center of the substrate toward the outer peripheral portion of the substrate, the ejection direction of the cleaning liquid nozzle is aligned with the direction of the centrifugal force acting on the substrate. Accordingly, since it is possible to remove the cleaning liquid from the outer peripheral side of the substrate, it is possible to prevent the cleaning liquid or the removed liquid material from being attached to the center of the substrate.

In the coating device, the cleaning liquid nozzle may be formed so as to be bent from the center toward the outer peripheral portion.

According to the aspect of the invention, since the cleaning liquid nozzle is formed so as to be bent from the center toward the outer peripheral portion, it is possible to adjust the ejection direction of the cleaning liquid with a simple configuration without separately providing an adjustment mechanism or the like adjusting the ejection direction of the cleaning liquid.

In the coating device, the accommodation mechanism may include an end portion accommodation portion which accommodates the lower end portion of the substrate and a downstream accommodation portion which accommodates the downstream of the substrate in the rotation direction of the substrate rather than the lower end portion of the substrate.

According to the aspect of the invention, it is possible to prevent scatter of the cleaning liquid or the removed liquid material at the lower end portion of the substrate and the downstream of the substrate in the rotation direction of the substrate rather than the lower end portion of the substrate.

In the coating device, the accommodation mechanism may include an upstream accommodation portion which accommodates the upstream of the substrate in the rotation direction of the substrate rather than the lower end portion of the substrate.

According to the aspect of the invention, it is possible to prevent scatter of the cleaning liquid or the removed liquid material at the upstream of the substrate in the rotation direction of the substrate rather than the lower end portion of the substrate.

In the coating device, the end portion accommodation portion may include a nozzle insertion portion.

According to the aspect of the invention, since the end portion accommodation portion includes a nozzle insertion portion, for example, the cleaning liquid nozzle or the like may be moved closer to the substrate. Accordingly, the process precision may be improved.

In the coating device, the removal unit may include a driving mechanism which elevates the accommodation mechanism.

According to the aspect of the invention, since it is possible to elevate the accommodation mechanism in accordance with the process state of the substrate, it is possible to smoothly perform a series of operations in which the substrate is carried to the removal unit, the process using the removal unit is performed, and the substrate is carried from the removal unit to the other units.

In the coating device, the application unit may include a cup mechanism which accommodates the substrate disposed at the first position.

According to the aspect of the invention, since the operation of ejecting the cleaning liquid to the substrate is performed at the outside of the cup mechanism, the inside of the cup mechanism may be kept to be clean.

According to the aspect of the invention, it is possible to provide the coating device capable of preventing a degradation of the throughput.

DETAILED DESCRIPTION OF THE INVENTION

Figure 1:
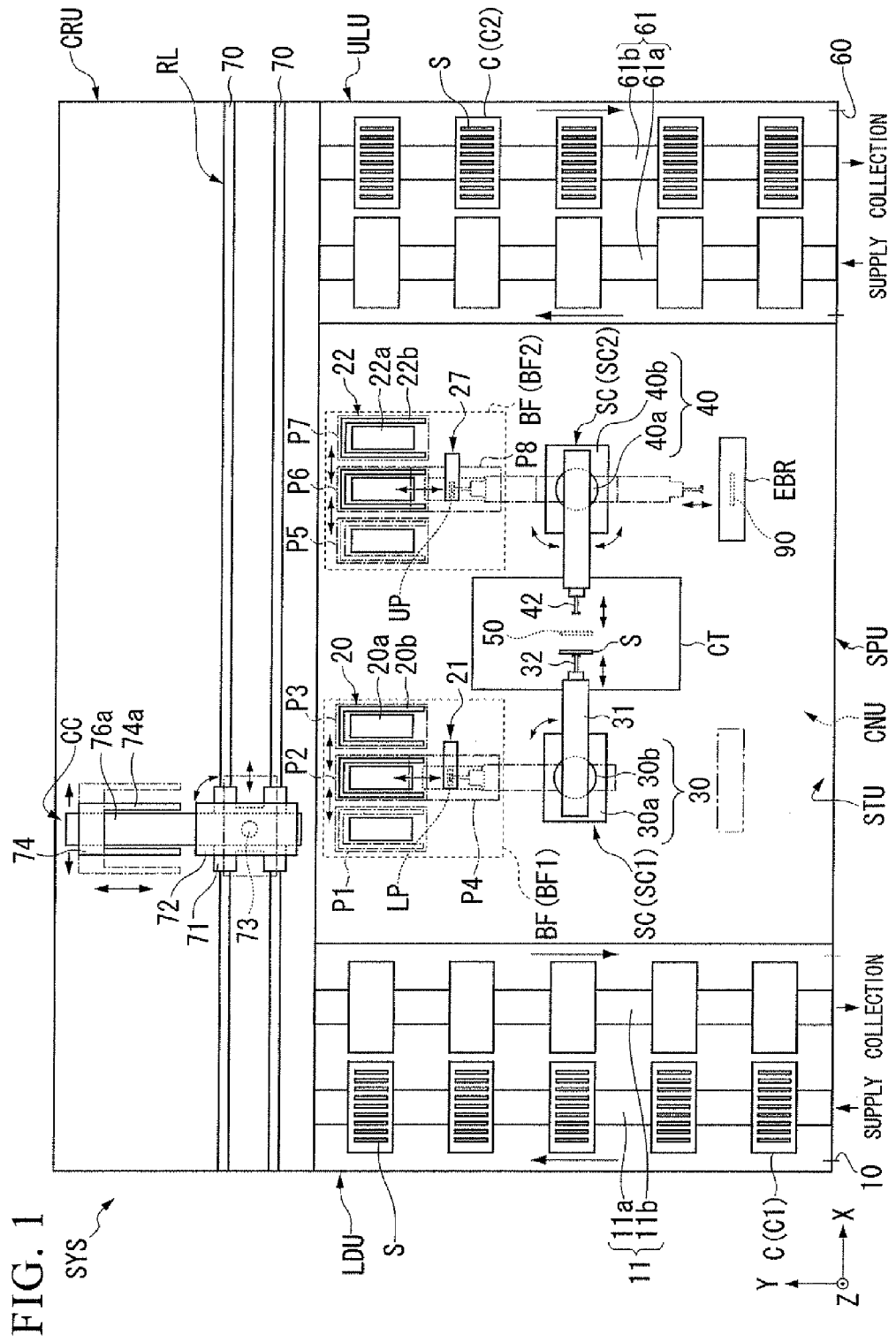
FIG. 1 is a plan view illustrating a configuration of a substrate processing system according to an embodiment of the invention.

An embodiment of the invention will be described by referring to the drawings.

Figure 2:
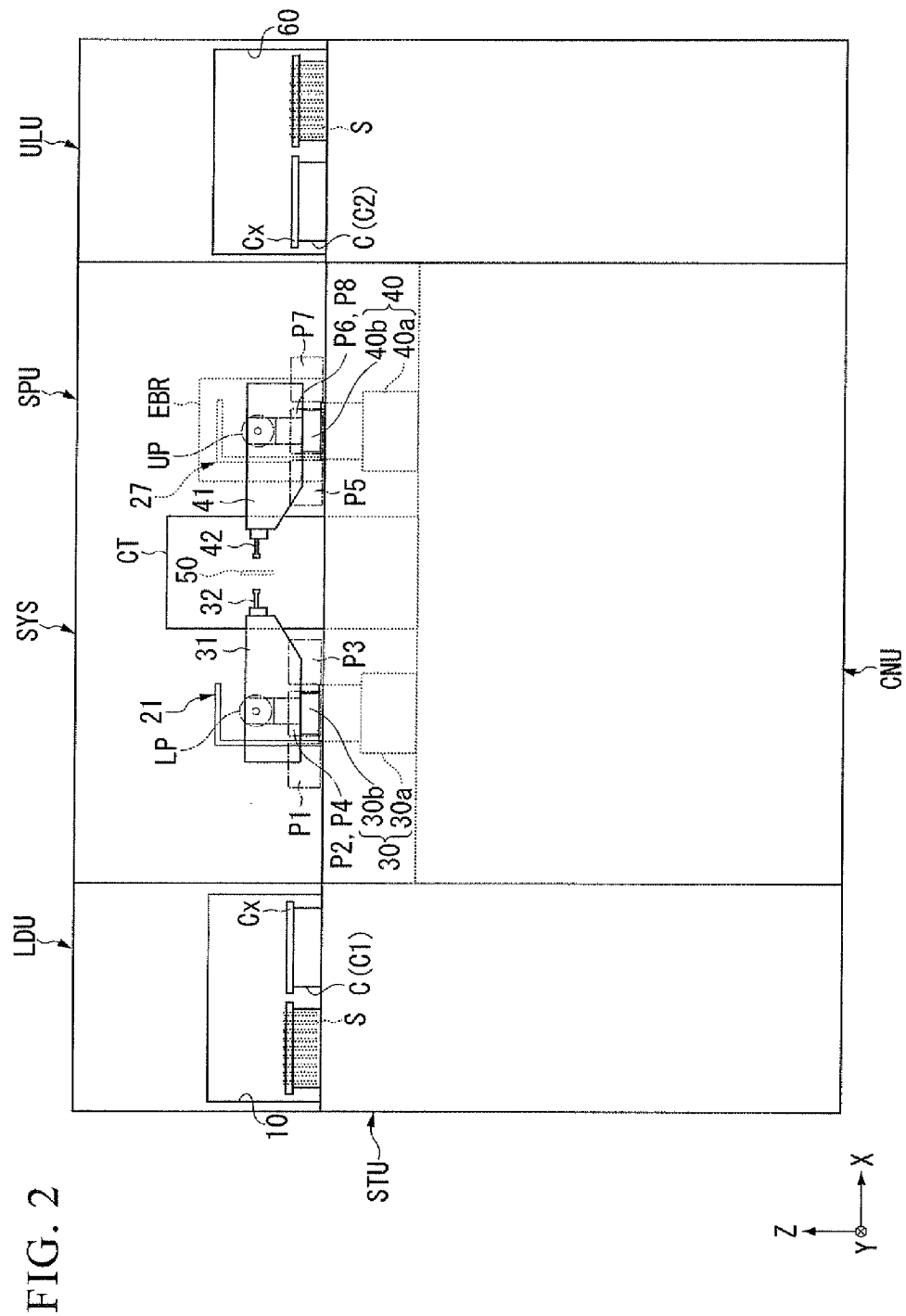
FIG. 2 is a front view illustrating the configuration of the substrate processing system according to the embodiment.
Figure 3:
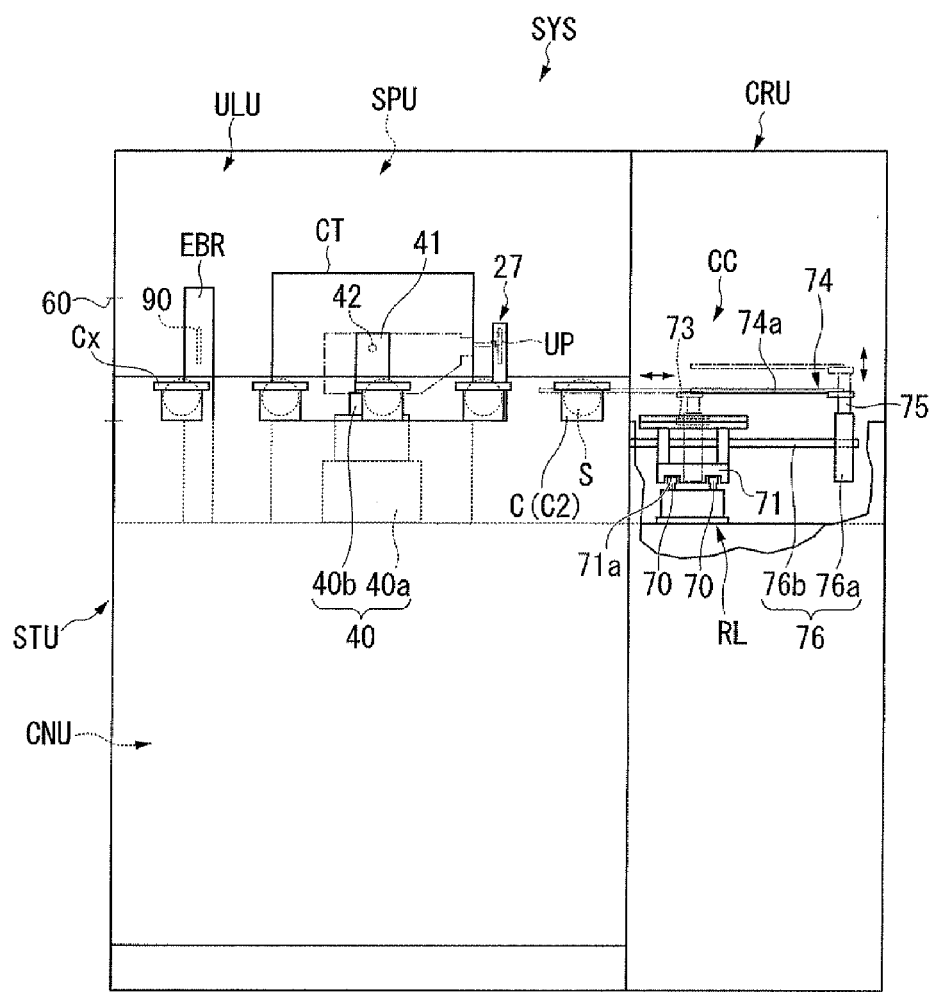
FIG. 3 is a side view illustrating the configuration of the substrate processing system according to the embodiment.

FIG. 1 is a plan view illustrating a schematic configuration of a substrate processing system SYS according to the embodiment. FIG. 2 is a front view illustrating a schematic configuration of the substrate processing system SYS. FIG. 3 is a side view illustrating the schematic configuration of the substrate processing system SYS.

In the embodiment, the directions of the drawings are simply marked by using the XYZ coordinate system for the description of the configuration of the substrate processing system SYS. In the XYZ coordinate system, the left/right direction of the drawings is marked as the X direction and the direction perpendicular to the X direction in the plan view is marked as the Y direction. The direction perpendicular to the plane including the axes of the X direction and the Y direction is marked as the Z direction. In each of the X direction, the Y direction, and the Z direction, the direction indicated by the arrow is described as the + direction and the direction opposite to the direction indicated by the arrow is described as the − direction.

As shown in FIGS. 1 to 3, the substrate processing system SYS is, for example, a system that is used by being included in a production line of a factory or the like to form a thin coating film on a predetermined area of the substrate S. The substrate processing system SYS includes a stage unit STU, a substrate processing unit (coating device) SPU, a substrate loading unit LDU, a substrate unloading unit ULU, a carrying unit CRU, and a control unit CNU.

In the substrate processing system SYS, the stage unit STU is supported on a surface of a floor through, for example, a leg portion, and the substrate processing unit SPU, the substrate loading unit LDU, the substrate unloading unit ULU, and the carrying unit CRU are disposed on the upper surface of the stage unit STU. The interior of each of the substrate processing unit SPU, the substrate loading unit LDU, the substrate unloading unit ULU, and the carrying unit CRU is covered by a cover member. In the substrate processing system SYS, the substrate processing unit SPU, the substrate loading unit LDU, and the substrate unloading unit ULU are arranged in a straight line along the X direction. The substrate processing unit SPU is provided between the substrate loading unit LDU and the substrate unloading unit ULU.

In the plan view, the center of the portion where the substrate processing unit SPU is disposed on the stage unit STU is recessed in the −Z direction compared to the other units.

As a substrate S to be processed in the substrate processing system SYS of the embodiment, for example, a semiconductor substrate such as silicone, a glass substrate constituting a liquid crystal panel, a substrate constituting a hard disk, and the like may be mentioned. In the embodiment, for example, a substrate S will be described, where the substrate S forms a hard disk, having a diamond coating on a surface of a disc-shaped base formed of glass, and having an opening portion formed at the center thereof in the plan view.

In the substrate processing system SYS of the embodiment, the substrate S is loaded or unloaded by a cassette C capable of accommodating multiple substrates S. The cassette C is a square container, and is capable of accommodating the multiple substrates S in a straight line so that the substrate surfaces of the substrates S face each other. Accordingly, the cassette C is configured to accommodate the substrate S while the substrate S stands upright in the Z direction. The cassette C has an opening portion formed at the bottom portion thereof. Each substrate S is accommodated while being exposed to the bottom portion of the cassette C through the opening portion. The cassette C is formed in a rectangular shape in the plan view, and for example, as shown in FIG. 2, the cassette C has an engagement portion Cx formed at each +Z side thereof. In the embodiment, as the cassette C, two types of cassettes are used, where one type is a loading cassette C1 which is used to load the substrate S and an unloading cassette C2 which is used to unload the substrate S. The loading cassette C1 accommodates only the unprocessed substrate S, and the unloading cassette C2 accommodates only the processed substrate S. The loading cassette C1 is used between the substrate processing unit SPU and the substrate loading unit LDU. The unloading cassette C2 is used between the substrate processing unit SPU and the substrate unloading unit ULU. Accordingly, the loading cassette C1 and the unloading cassette C2 are not used together for the same purpose.

The loading cassette C1 and the unloading cassette C2 are formed to have, for example, the same shape and the same dimensions.

(Substrate Loading Unit)

The substrate loading unit LDU is disposed at the −X side in the substrate processing system SYS.

The substrate loading unit LDU is a unit to which the loading cassette C1 accommodating the unprocessed substrate S is supplied and in which the empty loading cassette C1 is collected. The substrate loading unit LDU is formed to be elongated in the Y direction, and loading cassettes C1 are disposed along the Y direction in a standby state.

The substrate loading unit LDU includes a cassette entrance 10 and a cassette moving mechanism (a second moving mechanism) 11. The cassette entrance 10 is an opening portion which is provided at the −Y side of a cover member covering the substrate loading unit LDU. The cassette entrance 10 is an entrance (a supply opening) of the loading cassette C1 accommodating the unprocessed substrate S and an exit (a collection opening) of the empty loading cassette C1.

The cassette moving mechanism 11 includes, for example, a driving mechanism such as a belt conveyor mechanism. In the embodiment, as the driving mechanism, a conveyor belt (a supply belt 11a and a collecting belt 11b) is provided. The conveyor belt extends from the +Y-side end portion of the substrate loading unit LDU to the −Y-side end portion thereof in the Y direction, and two conveyor belts are disposed in parallel in the X direction.

The supply belt 11a is a conveyor belt which is disposed at the −X side among the two conveyor belts. The +Z side of the supply belt 11a is used as a carrying surface. The supply belt 11a is configured to rotate so that the carrying surface moves in the +Y direction. Loading cassettes C1 entering the substrate loading unit LDU through the cassette entrance 10 are placed on the carrying surface of the supply belt 11a. The loading cassette C1 is configured to move toward the carrying unit CRU through the rotation of the supply belt 11a.

The collecting belt 11b is a conveyor belt which is disposed at the +X side among the two conveyor belts. The +Z side of the collecting belt 11b is used as a carrying surface. The collecting belt 11b is configured to rotate so that the carrying surface moves in the −Y direction. Empty loading cassettes C1 are placed on the carrying surface of the collecting belt 11b. The loading cassette C1 is configured to move toward the cassette entrance 10 through the rotation of the collecting belt 11b.

In the embodiment, for example, the loading cassettes C1 may be disposed in a standby state at five standby positions (container standby positions) on each of the supply belt 11a and the collecting belt 11b. In the substrate loading unit LDU, the standby position for the loading cassette C1 may be moved by rotating the supply belt 11a and the collecting belt 11b, and the carrying time of the loading cassette C1 may be shortened by moving the standby position.

(Substrate Processing Unit)

The substrate processing unit SPU is disposed substantially at the center of the X direction in the substrate processing system SYS. The substrate processing unit SPU is a unit which is used to perform various processes on the substrate S, and the process includes a process forming a thin coating film on the substrate S by coating a liquid material such as a resist thereon, a process removing a thin coating film formed on the peripheral portion of the substrate S, and the like. The substrate processing unit SPU includes buffer mechanisms BF, a substrate carrying mechanism (a rotation mechanism) SC, an application mechanism CT, and a peripheral edge portion removal mechanism (an adjustment portion) EBR.

The buffer mechanisms BF are respectively provided at two positions with the application mechanism CT interposed therebetween in the X direction along the +Y side of the substrate processing unit SPU. In the buffer mechanisms BF disposed at two positions, the buffer mechanism disposed at the −X side of the application mechanism CT is a loading-side buffer mechanism (a substrate loading area) BF1, and the buffer mechanism disposed at the +X side of the application mechanism CT is an unloading-side buffer mechanism (a substrate unloading area) BF2.

The loading-side buffer mechanism BF1 is a portion which allows the loading cassette C1 to be in a standby state. The loading-side buffer mechanism BF1 has standby positions for the loading cassette C1. For example, the loading-side buffer mechanism BF1 may have four standby positions for the loading cassette C1 (the standby positions P1 to P4). The three standby positions P1 to P3 among these are arranged in the X direction. The standby position P1 disposed at the −X side of the drawing is, for example, the standby position for the loading cassette C1 supplied to the substrate processing unit SPU. The standby position P2 at the center of the X direction of the drawing is the standby position for the loading cassette C1 moved from the standby position P1. The standby position P3 at the +X side of the drawing is the standby position for the loading cassette C1 moved from the standby position P2. Further, the standby position P4 is disposed at the −Y side with respect to the standby position P2. A loading position LP of the substrate S is provided above the standby position P4 in the +Z direction. The substrate S is carried to the application mechanism CT through the loading position LP.

The unloading-side buffer mechanism BF2 is a portion which allows the unloading cassette C2 to be in a standby state. The unloading-side buffer mechanism BF2 has standby positions for the unloading cassette C2. For example, the unloading-side buffer mechanism BF2 may have four standby positions for the unloading cassette C2 (the standby positions P5 to P8). The three standby positions P5 to P7 are arranged in the X direction. The standby position P5 at the −X side of the drawing is, for example, the standby position for the unloading cassette C2 supplied to the substrate processing unit SPU. The standby position P6 at the center in the X direction is the standby position for the unloading cassette C2 moved from the standby position P5. The standby position P7 at the +X side of the drawing is the standby position for the unloading cassette C2 moved from the standby position P6. Further, the standby position P8 is disposed at the −Y side with respect to the standby position P6. An unloading position UP of the substrate S is provided above the standby position P8 in the +Z direction. The substrate S is carried from the application mechanism CT through the unloading position UP.

Figure 4:
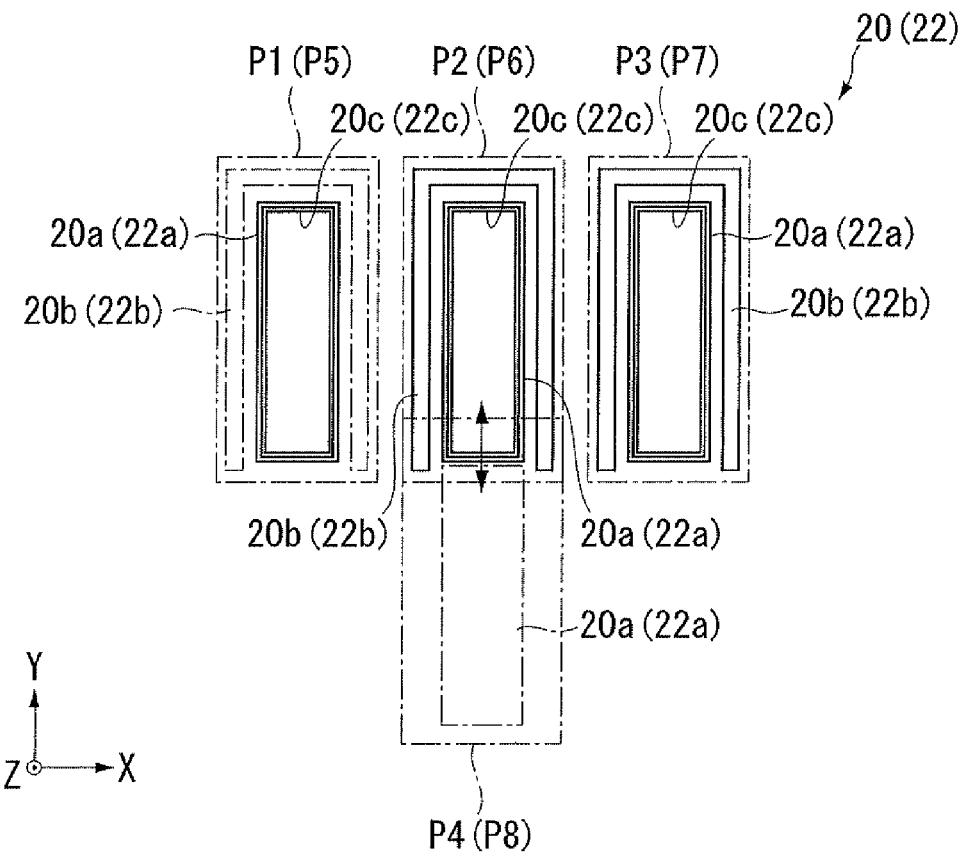
FIG. 4 is a diagram illustrating a configuration of a buffer mechanism.
Figure 5:
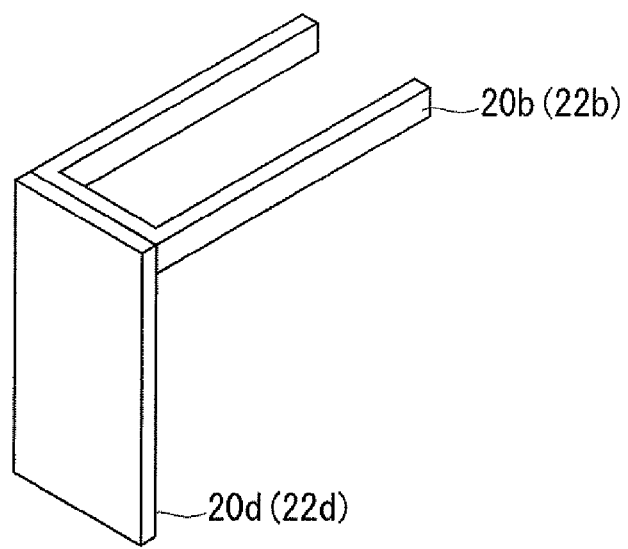
FIG. 5 is a diagram illustrating a configuration of the buffer mechanism.
Figure 6:
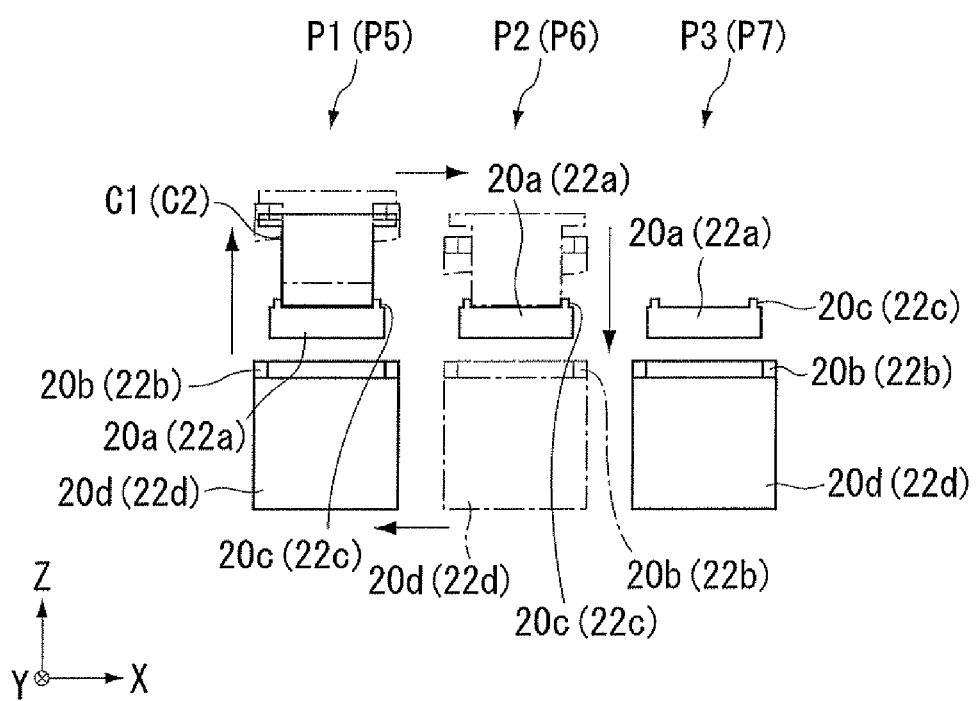
FIG. 6 is a diagram illustrating a configuration of the buffer mechanism.

FIG. 4 is an enlarged diagram illustrating cassette moving mechanisms 20 and 22 of FIG. 1. FIG. 5 is a diagram illustrating a configuration of a part of the cassette moving mechanisms 20 and 22. FIG. 6 is a diagram illustrating the cassette moving mechanisms 20 and 22 when seen from the +Y direction. Since the cassette moving mechanism 20 and the cassette moving mechanism 22 have the same configuration, the cassette moving mechanism 20 will be described. In FIGS. 4 to 6, the components (including the unloading cassette C2 and the standby positions P5 to P8) of the cassette moving mechanism 22 corresponding to the components (including the loading cassette C1 and the standby positions P1 to P4) of the cassette moving mechanism 20 are denoted by symbols placed in brackets.

As shown in FIGS. 1 and 4 to 6, the loading-side buffer mechanism BF1 includes the cassette moving mechanism (the third moving mechanism) 20. The cassette moving mechanism 20 includes a cassette placing member 20a and a cassette carrying arm 20b. The cassette placing member 20a is a plate-like member which is provided at each of the standby positions P1 to P3. The loading cassette C1 is placed on the +Z-side surface of the cassette placing member 20a.

As shown in FIGS. 1 and 4, the cassette placing member 20a provided at the standby position P2 is configured to move in the Y direction by a driving unit (not shown). For this reason, the cassette placing member 20a provided at the standby position P2 is configured to move between the standby position P2 and the standby position P4 by way of the driving unit. The cassette placing members 20a provided at the standby positions P1 and P3 are fixed.

As shown in FIGS. 4 and 6, an annular convex portion 20c is formed in the +Z-side surface (the placing surface) of the cassette placing member 20a along the outer periphery of the loading cassette C1. Since the convex portion 20c is provided, the loading cassette C1 is fitted into the convex portion 20c while the loading cassette C1 is placed on the cassette placing member 20a. For this reason, the loading cassette C1 may be positioned and the positional deviation of the loading cassette C1 may be prevented.

The cassette carrying arms 20b are respectively provided at two positions among the standby positions P1 to P3. Each cassette carrying arm 20b is formed along the outer periphery of the cassette placing member 20a when seen in the Z direction. The cassette carrying arm 20b is configured to be movable in the X direction and the Z direction by a driving unit (not shown).

As shown in FIG. 5, the cassette carrying arm 20b is supported while being fixed to an arm support member 20d. A driving mechanism (not shown) is connected to the arm support member 20d. The driving mechanism (not shown) is configured to move the arm support member 20d in the X direction and the Z direction. The cassette carrying arm 20b is configured to be movable together with the movement of the arm support member 20d. As shown in FIG. 6, the cassette carrying arm 20b is configured to be movable to the +Z side and the −Z side of the cassette placing member 20a.

Since the positional relationship and the function of the components of the cassette moving mechanism 22 are the same as those of the cassette moving mechanism 20, the description thereof will be omitted. Hereinafter, when mentioning the components of the cassette moving mechanism 22, the same names as those of the components of the cassette moving mechanism 20 will be used and the symbols placed in brackets of FIGS. 4 to 6 will be added to the end of the name.

As shown in FIGS. 1 to 3, the substrate processing unit SPU includes a substrate loading mechanism 21 and a substrate unloading mechanism 27 near the buffer mechanism BF. The substrate loading mechanism 21 is disposed near the standby position P4. On the other hand, the substrate unloading mechanism 27 is disposed near the standby position P8. The configuration of the substrate loading mechanism 21 and the substrate unloading mechanism 27 will be described. Since the substrate loading mechanism 21 and the substrate unloading mechanism 27 have the same configuration, hereinafter, the substrate loading mechanism 21 will be described.

Figure 7:
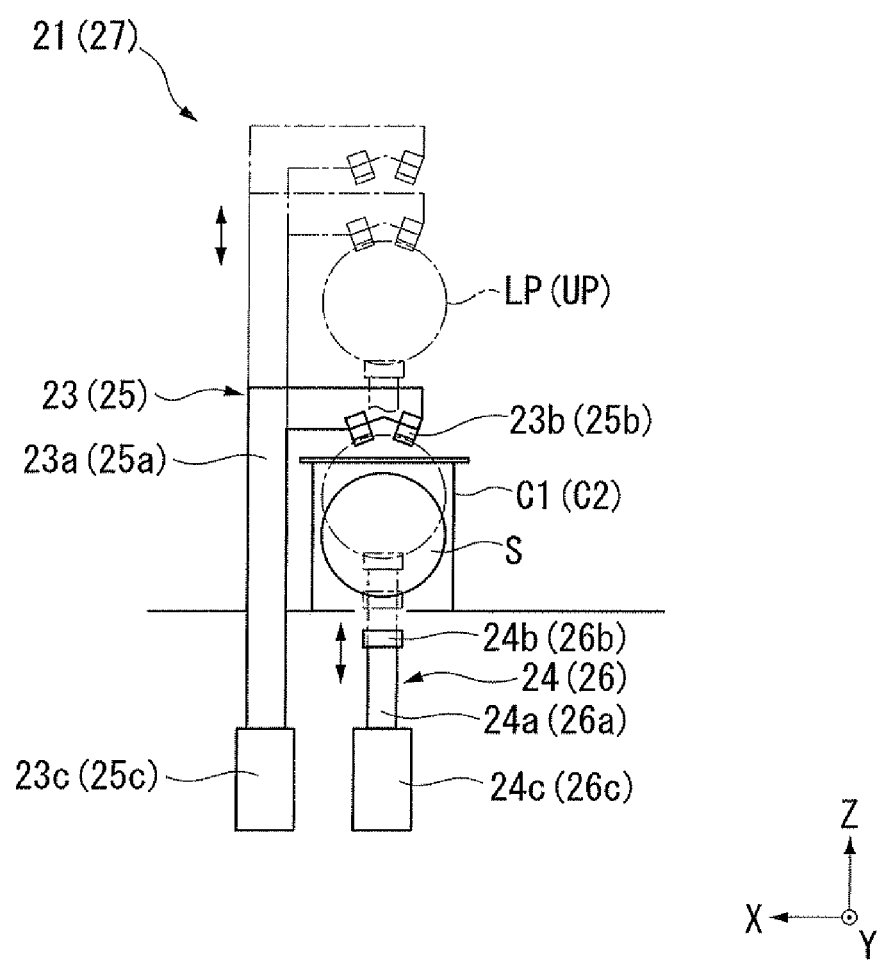
FIG. 7 is a diagram illustrating a configuration of a substrate loading mechanism and a substrate unloading mechanism.
Figure 8:
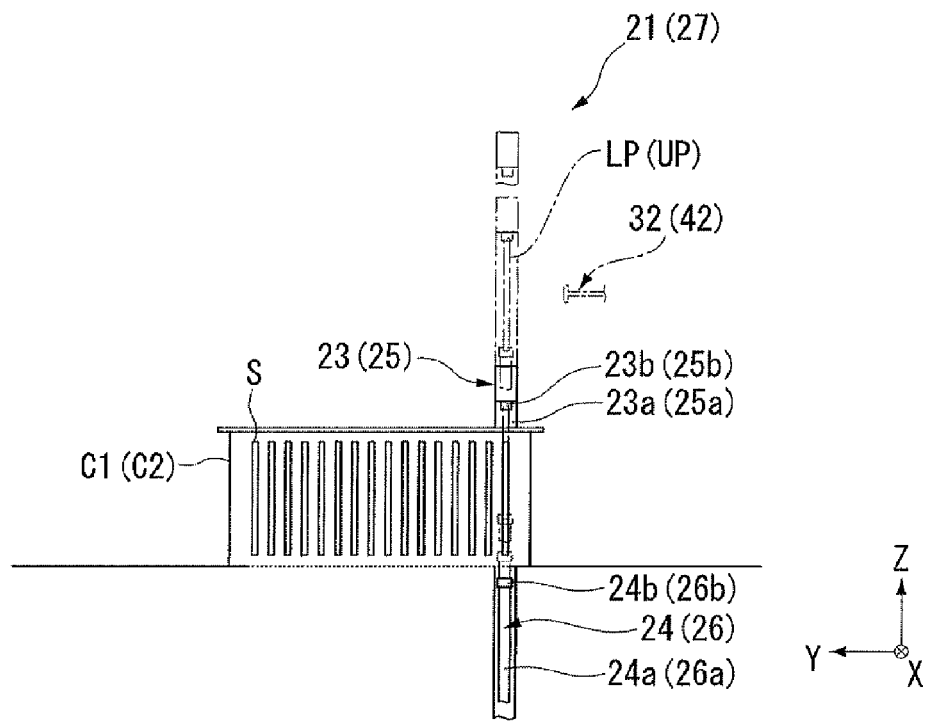
FIG. 8 is a diagram illustrating a configuration of the substrate loading mechanism and the substrate unloading mechanism.
Figure 9:
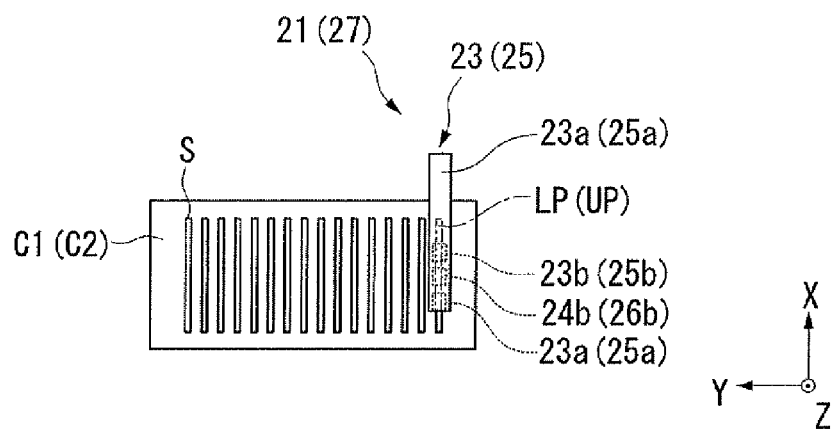
FIG. 9 is a diagram illustrating a configuration of the substrate loading mechanism and the substrate unloading mechanism.

FIGS. 7 to 9 are diagrams schematically illustrating the configuration of the substrate loading mechanism 21 and the substrate unloading mechanism 27. In FIGS. 7 to 9, the components (including the unloading position UP) of the substrate unloading mechanism 27 corresponding to the components (including the loading position LP) of the substrate loading mechanism 21 are denoted by symbols put in brackets.

As shown in FIGS. 7 to 9, the substrate loading mechanism 21 includes an upper substrate portion holding mechanism 23 and a lower substrate portion holding mechanism 24. The upper substrate portion holding mechanism 23 is disposed at the +X side of the standby position P4. The upper substrate portion holding mechanism 23 moves in the Z direction while holding the +Z side of the substrate S. The upper substrate portion holding mechanism 23 includes an elevation member 23a, a clamping member 23b, and an elevation mechanism 23c.

The elevation member 23a is a columnar support member which is formed in an L-shape in the side view, and is configured to be movable in the Z direction. The elevation member 23a includes a columnar support portion which extends in the Z direction and a protrusion portion protruding from the upper end of the columnar support portion in the X direction. The columnar support portion is provided from the +Z end surface of the loading cassette C1 up to the +Z side. The protrusion portion in the elevation member 23a is disposed at a position overlapping with the loading position LP in the plan view. The −Z side of the protrusion portion is provided with a concave portion matching the shape of the substrate S.

The clamping member 23b is attached to the concave portion of the elevation member 23a. Accordingly, the clamping member 23b is also provided at a position overlapping with the loading position LP in the plan view. The elevation mechanism 23c is a driving unit attached to the elevation member 23a, and is disposed at the −Z side of the loading cassette C1. As the elevation mechanism 23c, for example, a driving mechanism such as an air cylinder may be used.

The lower substrate portion holding mechanism 24 is provided at a position overlapping with the center of the loading position LP in the plan view. The lower substrate portion holding mechanism 24 moves in the Z direction while holding the −Z side of the substrate S. The lower substrate portion holding mechanism 24 includes an elevation member 24a, a clamping member 24b, and an elevation mechanism 24c. The elevation member 24a is a rod-shaped columnar support member, and is configured to be movable in the Z direction. The clamping member 24b is attached to the +Z-side front end of the elevation member 24a, and the clamping member 24b is also provided at a position overlapping with the center of the loading position LP in the plan view. The elevation mechanism 24c is a driving unit attached to the elevation member 24a, and is disposed at the −Z side of the loading cassette C1. As the elevation mechanism 24c, for example, a driving mechanism such as an air cylinder may be used.

The elevation mechanism 23c of the upper substrate portion holding mechanism 23 and the elevation mechanism 24c of the lower substrate portion holding mechanism 24 may be independently operated and may be operated in a synchronized manner.

Since the positional relationship and the function of the components of the substrate unloading mechanism 27 are the same as those of the corresponding components of the substrate loading mechanism 21, the description thereof will be omitted. Hereinafter, when mentioning the components of the substrate unloading mechanism 27, the same names as those of the corresponding components of the substrate loading mechanism 21 will be used and the symbols placed in brackets of FIGS. 7 to 9 will be added to the end of the name.

As shown in FIGS. 1 to 3, the substrate carrying mechanism SC is provided at two positions with the application mechanism CT interposed therebetween in the X direction to be located at the center of the Y direction of the substrate processing unit SPU. In the substrate carrying mechanisms SC provided at two positions, the mechanism disposed at the −X side of the application mechanism CT is a loading-side carrying mechanism SC1, and the mechanism disposed at the +X side of the application mechanism CT is an unloading-side carrying mechanism SC2. The loading-side carrying mechanism SC1, the unloading-side carrying mechanism SC2, and the application mechanism CT are disposed in a straight line along the X direction.

The loading-side carrying mechanism SC1 may access the application mechanism CT and the loading position LP of the loading-side buffer mechanism BF1 and carry the substrate S therebetween. The unloading-side carrying mechanism SC2 may access the application mechanism CT, the unloading position UP of the unloading-side buffer mechanism BF2, and the peripheral edge portion removal mechanism EBR and carry the substrate S therebetween.

Figure 10:
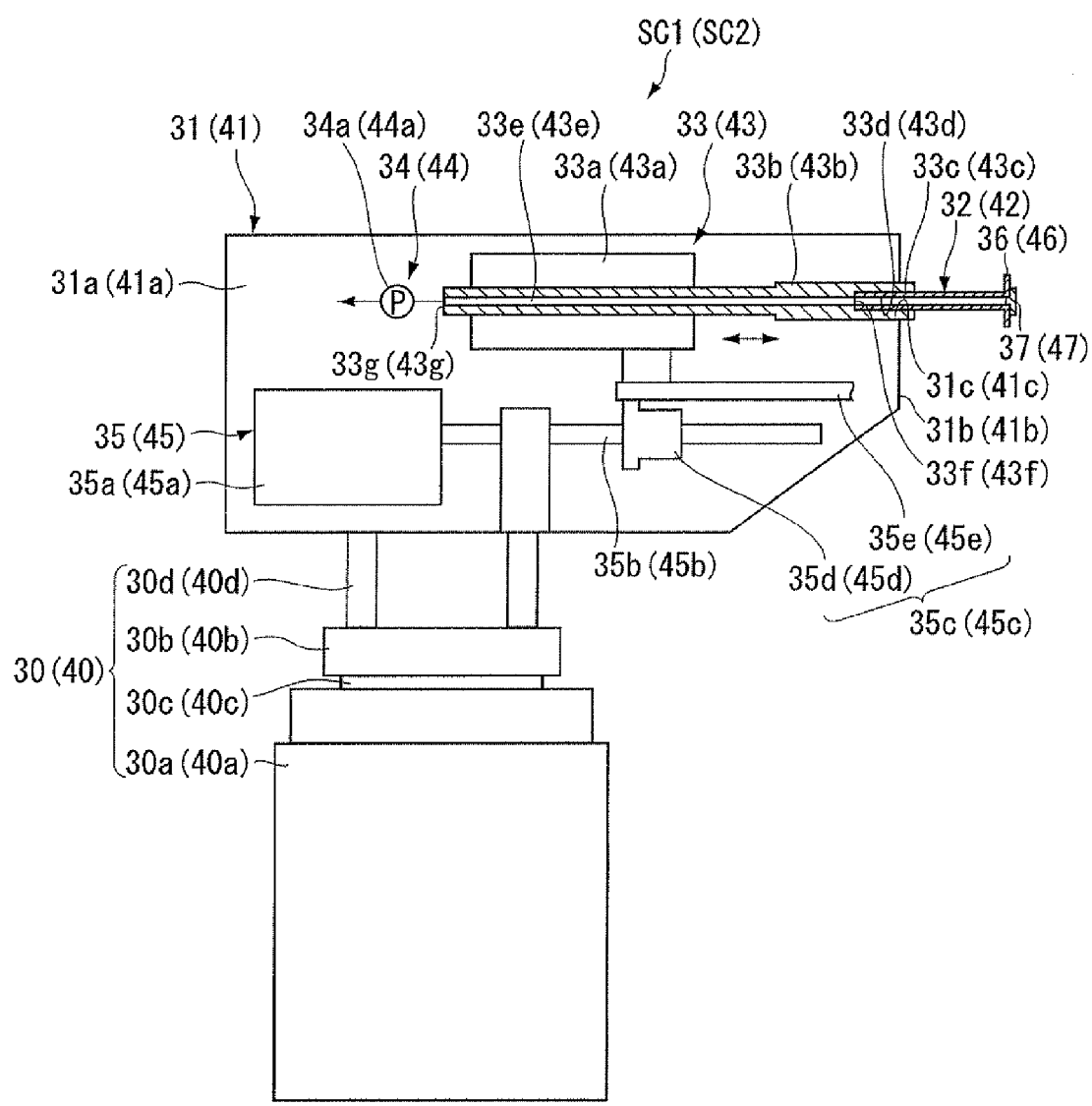
FIG. 10 is a diagram illustrating a configuration of a holding portion.

FIG. 10 is a schematic diagram illustrating the configuration of the loading-side carrying devices SC1 and SC2. Since the loading-side carrying mechanism SC1 and the unloading-side carrying mechanism SC2 have the same configuration, hereinafter, the loading-side carrying mechanism SC1 will be described. In FIG. 10, the components (including the unloading position UP) of the loading-side carrying device SC2 corresponding to the components (including the loading position LP) of the loading-side carrying device SC1 are denoted by symbols in brackets.

As shown in FIG. 10, the loading-side carrying mechanism SC1 includes a base portion 30, an arm portion 31, and a holding portion 32. The base portion 30 is provided on an upper surface of a recessed portion of the stage unit STU. The base portion 30 includes a fixed table 30a, a rotation table 30b, a rotation mechanism 30c, and a support member 30d.

The fixed table 30a is fixed to the upper surface of the recessed portion of the stage unit STU. The base portion 30 is fixed onto the stage unit STU with the fixed table 30a interposed therebetween so that positional deviation thereof does not occur. The rotation table 30b is disposed on the fixed table 30a with the rotation mechanism 30c interposed therebetween. The rotation table 30b is provided to be rotatable with respect to the fixed table 30a about the Z axis serving as a rotation axis. The rotation mechanism 30c is provided between the fixed table 30a and the rotation table 30b, and is a driving mechanism that applies a rotation force to the rotation table 30b. The support member 30d is a columnar support member of which the −Z-side end portion is fixed onto the rotation table 30b. The support member 30d is provided at multiple positions, for example, two positions of the rotation table 30b. The +Z-side end portion of the support member 30d is inserted into the arm portion 31.

The arm portion 31 is supported by the support member 30d of the base portion 30. The arm portion 31 moves the holding portion 32 to different positions within the substrate processing unit SPU. The arm portion 31 includes a pentagonal columnar casing 31a. A front end surface 31b of the casing 31a is provided with an opening portion 31c. The casing 31a has therein a rotation mechanism 33, a suction mechanism 34, and a moving mechanism 35.

The rotation mechanism 33 is disposed at the +Z side inside the casing 31a. The rotation mechanism 33 includes a motor device 33a and a rotation shaft member 33b. The motor device 33a and the rotation shaft member 33b are configured to be movable together in the left/right direction of the drawing. The motor device 33a is a driving device which applies a rotation force to the rotation shaft member 33b. The rotation shaft member 33b is a bar-like member which is disposed to be parallel to the XY plane and has a circular cross-section.

The rotation shaft member 33b is configured to rotate about the rotation axis by the driving force of the motor device 33a. The rotation shaft member 33b is disposed so that one end thereof protrudes from the opening portion 31c to the outside of the casing 31a (a protrusion portion 33c). The end surface at the side of the protrusion portion 33c of the rotation shaft member 33b is provided with a concave portion 33d which is used for the attachment of the holding portion 32. The concave portion 33d has a circular cross-section. The protrusion portion 33c includes a fixation mechanism which fixes the holding portion 32 while the holding portion 32 is attached to the concave portion 33d. When the holding portion 32 is fixed by the fixation mechanism, the rotation shaft member 33b and the holding portion 32 may rotate together.

The rotation shaft member 33b includes a penetration hole 33e. The penetration hole 33e is formed to penetrate a bottom surface 33f of the concave portion 33d of the rotation shaft member 33b and the other end surface 33g of the rotation shaft member 33b along the direction of the rotation shaft. The bottom surface 33f of the concave portion 33d of the rotation shaft member 33b may communicate with the end surface 33g thereof through the penetration hole 33e.

The suction mechanism 34 is provided on the side of the end surface 33g of the rotation shaft member 33b. The suction mechanism 34 includes a suction device such as a suction pump 34a. The suction pump 34a is connected to the penetration hole 33e at the end surface 33g of the rotation shaft member 33b. When the suction pump 34a suctions the penetration hole 33e from the end surface 33g of the rotation shaft member 33b, the suction pump 34a may suction the bottom surface 33f of the concave portion 33d communicating with the penetration hole 33e.

The moving mechanism 35 is disposed at the −Z side inside the casing 31a. The moving mechanism 35 includes a motor device 35a, a rotation shaft member 35b, and a movable member 35c. The motor device 35a is a driving device which applies a rotation force to the rotation shaft member 35b. The rotation shaft member 35b is a bar-like member of which one end is inserted into the motor device 35a and which has a circular cross-section. The rotation shaft member 35b is configured to rotate about the rotation axis by the driving force of the motor device 35a. The surface of the rotation shaft member 35b is provided with a thread (not shown).

The movable member 35c includes a threading portion 35d and a connection member 35e. The threading portion 35d is integrally formed with the rotation shaft member 35b and has a screw hole (not shown) formed on the surface thereof.

The connection member 35e is fixed to, for example, the motor device 33a of the rotation mechanism 33. The lower surface of the connection member 35e is provided with a thread, and the thread may mesh with the thread formed on the threading portion 35d.

When the rotation shaft member 35b rotates by the driving of the motor device 35a, the rotation shaft member 35b and the threading portion 35d rotate together. Through the rotation of the threading portion 35d, the connection member 35e meshing with the thread of the threading portion 35d moves in the left/right direction of the drawing, and the connection member 35e and the rotation mechanism 33 fixed to the connection member 35e move together in the left/right direction of the drawing. By this movement, the holding portion 32 provided at the right end of the rotation mechanism 33 in the drawing moves in the left/right direction of the drawing.

The holding portion 32 is detachably fixed to the concave portion 33d of the arm portion 31. The holding portion 32 holds the substrate S by using, for example, a holding force such as a suction force. The holding portion 32 includes a suction member 36 and a blocking member 37. The suction member 36 and the blocking member 37 are detachably provided.

In the loading-side carrying mechanism SC1 with the above-described configuration, when the arm portion 31 rotates about the Z axis serving as the rotation axis or moves in the direction of the XY plane, the holding portion 32 may access both the application mechanism CT and the loading position LP. Further, the loading-side carrying mechanism SC1 may hold the substrate S upright in the Z direction by the suction force of the suction pump 34a inside the arm portion 31 and may rotate the substrate S while being upright in the Z direction by rotating the rotation shaft member 33b inside the arm portion 31. Furthermore, the state where the substrate S is upright in the Z direction indicates the state where the substrate S is inclined with respect to the horizontal plane. In the embodiment, it is desirable to rotate the substrate S held upright while being inclined with respect to the horizontal plane at, for example, 70° to 90°. The rotation shaft members disposed in the arm portion 31 and the like rotating the substrate may have a configuration in which shaft members are connected to each other through a coupling.

Since the positional relationship and the function of the components of the unloading-side carrying mechanism SC2 are the same as those of the corresponding component of the loading-side carrying mechanism SC1, the description thereof will be omitted. Hereinafter, when mentioning the components of the unloading-side carrying mechanism SC2, the same names as those of the components of the loading-side carrying mechanism SC1 will be used and the symbols placed in brackets of FIG. 10 will be added to the end of the name.

Figure 11:
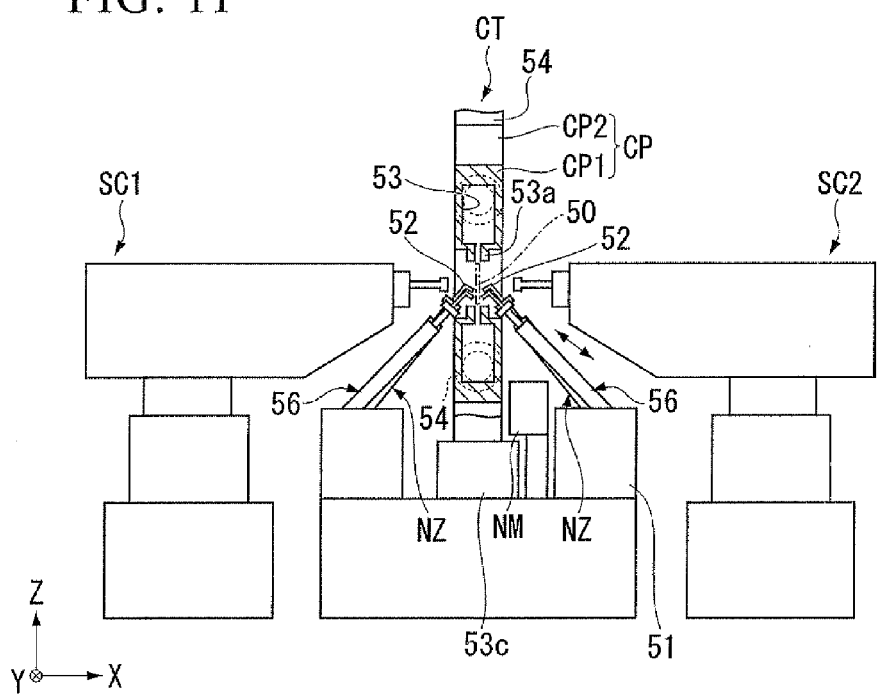
FIG. 11 is a front view illustrating a configuration of a substrate processing unit.
Figure 12:
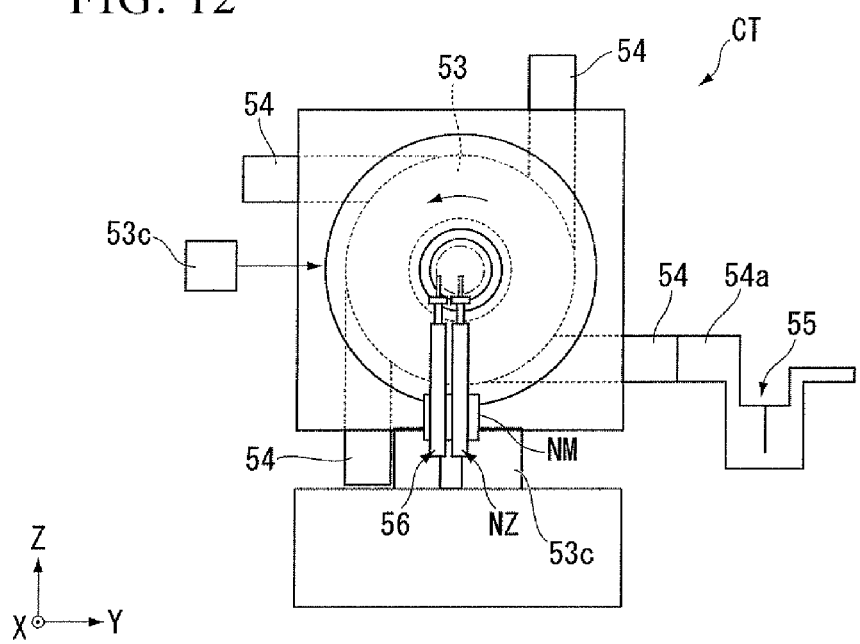
FIG. 12 is a side view illustrating a configuration of the substrate processing unit.
Figure 13:
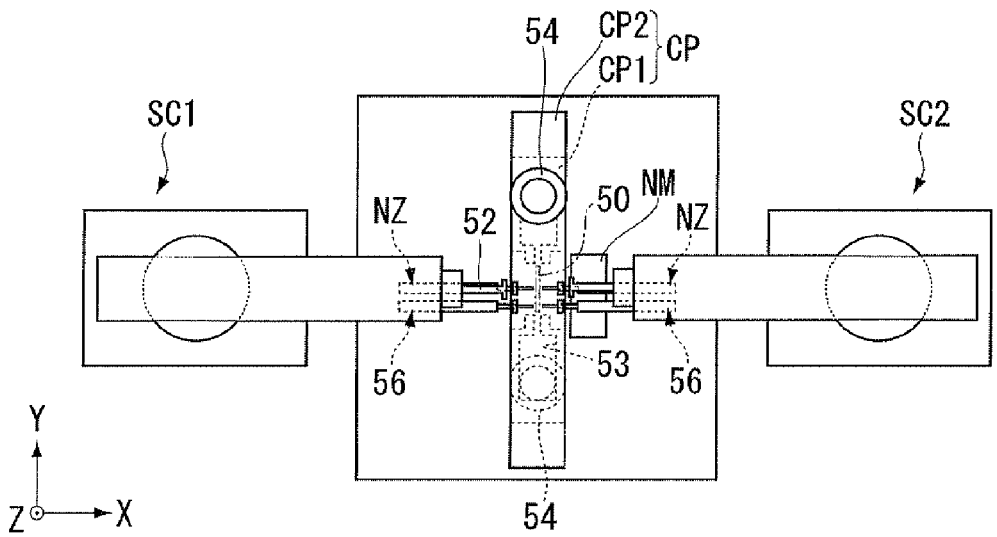
FIG. 13 is a plan view illustrating a configuration of the substrate processing unit.

As shown in FIGS. 1 to 3, the application mechanism CT is disposed substantially at a first position of the center of the substrate processing unit SPU in the plan view, and is fixed to the upper surface of the recessed portion of the stage unit STU. The application mechanism CT is a device which forms a thin coating film on the substrate S by coating a liquid material thereto. In the embodiment, the application mechanism CT forms a thin coating film used for an imprinting process on the substrate S. The substrate may access both the −X side and the +X side of the application mechanism CT. Accordingly, for example, the substrate S may be loaded or unloaded from either the −X side or the +X side. The application mechanism CT performs an application process at an application position 50 (a portion depicted by the dashed line. Refer to FIG. 11 and the like for symbols) substantially at the center in the X direction. FIGS. 11 to 13 are diagrams illustrating the configuration of the application mechanism CT. The application mechanism CT includes nozzle portions NZ, a cup portion CP, and a nozzle managing mechanism NM.

Figure 14:
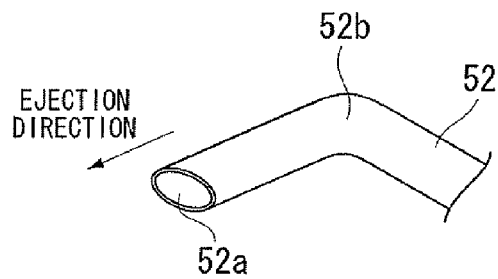
FIG. 14 is a diagram illustrating a configuration of a front end of a nozzle.

Each nozzle portion NZ is configured to access the center of the Y direction of the application position 50 by the nozzle moving mechanism 51. The nozzle portions NZ are disposed at the +X side and the −X side with the application position 50 interposed therebetween. The nozzle portion NZ includes a nozzle 52 which ejects a liquid material forming the thin coating film onto the substrate S. The nozzle 52 is formed to be bent at a bent portion 52b so as to eject a liquid material from the center of the substrate S toward the outer peripheral side thereof when accessing the application position. The nozzle 52 is provided at the −Z side with respect to the rotation axis of the substrate S. The nozzles 52 are disposed at the same position in the first surface side (the +X side) of the substrate S and the second surface side (the −X side) of the substrate S with respect to the application position 50 and are disposed to be symmetrical to each other in the X direction. As shown in FIG. 14, the nozzle 52 is formed so that an ejection surface 52a of the front end thereof is inclined with respect to the ejection direction of the liquid material. Since the front end of the nozzle 52 is formed to be sharp, for example, it is possible to satisfactorily stop the supply of the liquid material when the application of the liquid material is stopped.

The cup portion CP includes an inner cup CP1 and an outer cup CP2. The inner cup CP1 is formed in a circular shape when seen in the X direction, and is disposed to surround the side portion of the substrate S disposed at the application position 50. The outer cup CP2 is formed in a square shape when seen in the X direction, and is disposed to support the inner cup CP1 from the outside thereof. The outer cup CP2 is fixed to the upper surface of the stage unit STU through, for example, the support member and the like.

In the embodiment, the inner cup CP1 and the outer cup CP2 are integrally formed with each other, but may, of course, be formed independently.

The inner cup CP1 includes an accommodation portion 53 which accommodates a liquid material. The accommodation portion 53 includes a discharge mechanism 54 which discharges at least one of the liquid material and the gas inside the accommodation portion 53. The discharge mechanism 54 is provided along the tangential direction of the outer periphery of the inner cup CP1 formed in a circular shape. The discharge mechanism 54 is connected to the inside of the accommodation portion 53 of the inner cup CP1 through the outer cup CP2. As shown in FIG. 12, for example, the discharge mechanism 54 is provided for each side of the outer cup CP2, and the total number thereof is four. As shown in FIG. 12, each discharge mechanism 54 is connected to each discharge path. Each discharge path is provided with a trap mechanism 55 which is a gas-liquid separation mechanism which separates a gas and a liquid from each other. Furthermore, regarding another discharge mechanism 54 of FIGS. 11 to 13, the discharge path and the trap mechanism 55 are not shown.

Figure 15:
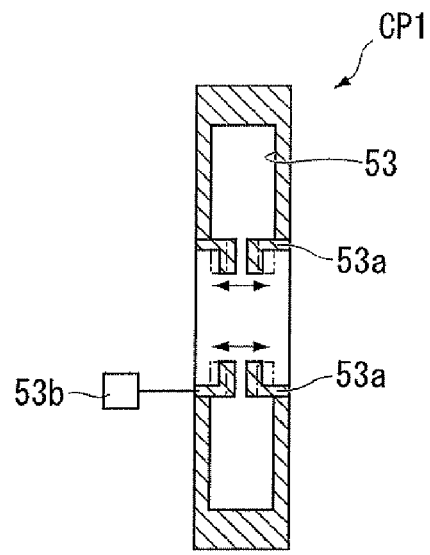
FIG. 15 is a diagram illustrating a configuration of an inner cup.

As the entrance of the accommodation portion 53, the portion 53a facing the side portion of the substrate S in the inner cup CP1 is provided to be attachable to or detachable from other portions of the inner cup CP1. As shown in FIG. 15, the inner cup CP1 includes an adjustment mechanism 53b which adjusts the opening length of the facing portion 53a. By using the adjustment mechanism 53b, for example, the opening length or the rebound state of the application liquid may be adjusted in accordance with the thickness of the substrate S. As shown in FIG. 12, the inner cup CP1 is provided with a rotation mechanism (a second rotation mechanism) 53c which rotates the inner cup CP1 along the outer periphery of the substrate S about the X axis serving as the rotation axis. A second nozzle 56 is provided on the −Y side of the nozzle 52 to eject a cleaning liquid of the cup portion CP.

Figure 16:
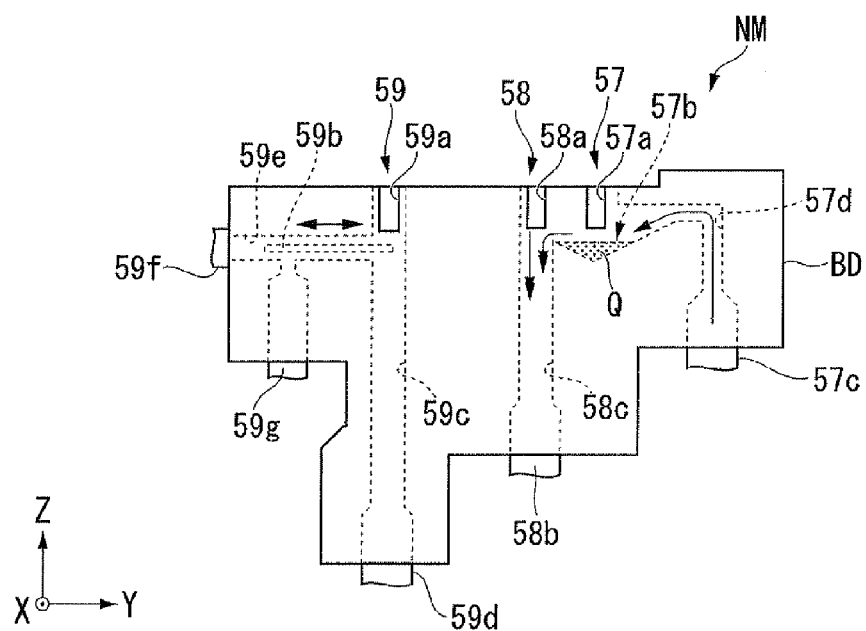
FIG. 16 is a diagram illustrating a configuration of a nozzle managing mechanism.

The nozzle managing mechanism NM manages the ejection state of the nozzle 52 so as to be constant. The nozzle managing mechanism NM is attached to the outer surface of the +X side of the cup portion CP. FIG. 16 is a diagram illustrating a configuration of the nozzle managing mechanism NM when seen in the −X direction. As shown in FIG. 16, the nozzle managing mechanism NM includes a casing BD, an impregnation portion 57, a discharge portion 58, and a preliminary ejection portion 59. The impregnation portion 57, the discharge portion 58, and the preliminary ejection portion 59 are provided for each casing BD, and are integrally formed with each other.

The impregnation portion 57 is a portion which immerses the front end of the nozzle 52 into an impregnation liquid Q in order to prevent the front end of the nozzle 52 from being dried. The impregnation portion 57 includes a nozzle locking portion 57a which locks the nozzle 52, an impregnation liquid storage portion 57b which stores the impregnation liquid Q therein, and an impregnation liquid supply portion 57c which supplies the impregnation liquid Q to the impregnation liquid storage portion 57b through a passage 57d. When the nozzle 52 is locked by the nozzle locking portion 57a, the front end of the nozzle 52 is impregnated with the impregnation liquid Q. As the impregnation liquid Q, for example, a cleaning liquid or the like may be used.

The discharge portion 58 is a portion which discharges the impregnation liquid. The discharge portion 58 includes a nozzle locking portion 58a which locks the nozzle 52 and a suction mechanism 58b which suctions a discharge passage 58c communicating with the impregnation liquid storage portion 57b. When the suction mechanism 58b is operated, the discharge passage 58c in which the front end portion of the nozzle 52 is disposed and the impregnation liquid storage portion 57b are simultaneously suctioned. The discharge portion 58 is disposed at the −Y side of the impregnation portion 57 to communicate with the impregnation portion 57. Since the discharge portion 58 communicates with the impregnation portion 57, the impregnation liquid overflowing from the impregnation portion 57 is discharged therefrom, and the impregnation liquid inside the impregnation portion 57 may be maintained at a constant amount.

The preliminary ejection portion 59 is a portion which discharges a preliminary liquid material from the nozzle 52. The preliminary ejection portion 59 includes a nozzle locking portion 59a which locks the nozzle 52, a preliminary ejection member 59b which is configured to be movable in the Y direction by a moving mechanism (not shown) and receives the liquid material discharged from the nozzle 52, a drain passage 59c and a drain mechanism 59d which discharge a part of the liquid material ejected from the nozzle 52, a suction passage 59e which is connected to the drain passage 59c, a suction mechanism 59f which suctions the inside of the suction passage 59e, and a cleaning liquid supply mechanism 59g which supplies a cleaning liquid to the preliminary ejection member 59b. When the preliminary ejection member 59b moves in the Y direction, the +Y-side end portion of the preliminary ejection member 59b may appear to the inside of the drain passage 59c and receive the liquid material ejected from the nozzle 52.

(Edge Portion Removal Mechanism)

The peripheral edge portion removal mechanism EBR removes the thin coating film formed at the peripheral edge of the substrate S. As shown in FIG. 1, for example, the substrate S is held at a holding position (a second position) 90 at the +X side of the application mechanism CT and the end side at the −Y side of the substrate processing unit SPU by a holding portion 42 of the unloading-side carrying mechanism SC2. The peripheral edge portion removal mechanism EBR is provided at a position including the holding position 90. It is desirable to perform the removal process using the peripheral edge portion removal mechanism EBR while the thin coating film formed on the substrate S is not dried. For this reason, it is desirable to dispose the peripheral edge portion removal mechanism EBR at a position where the substrate S may be carried from the application mechanism CT within a short time.

Figure 17:
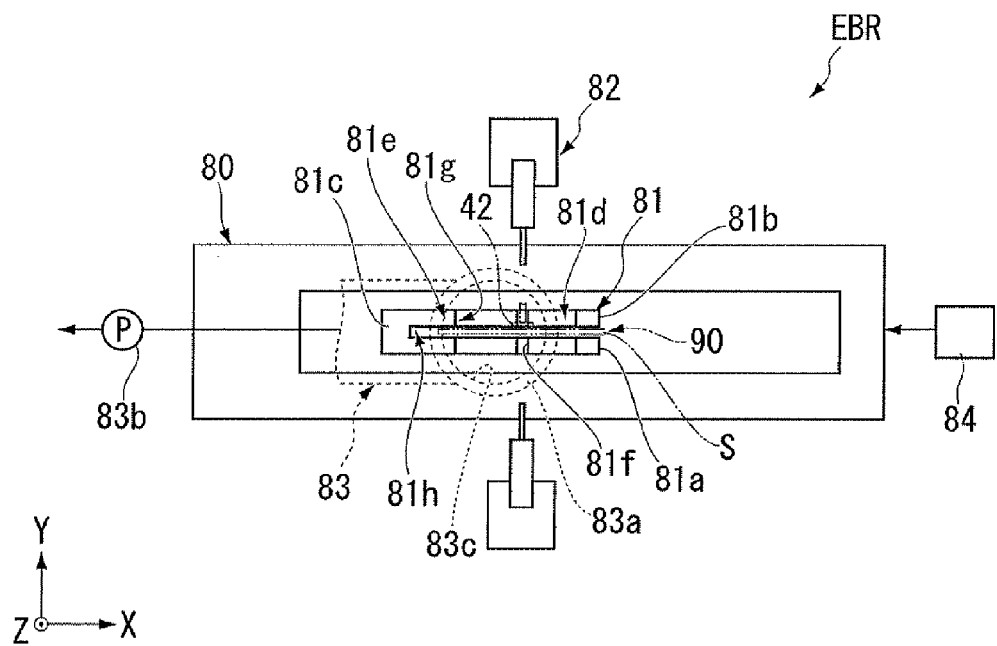
FIG. 17 is a diagram illustrating a configuration of a peripheral edge portion removal mechanism.
Figure 18:
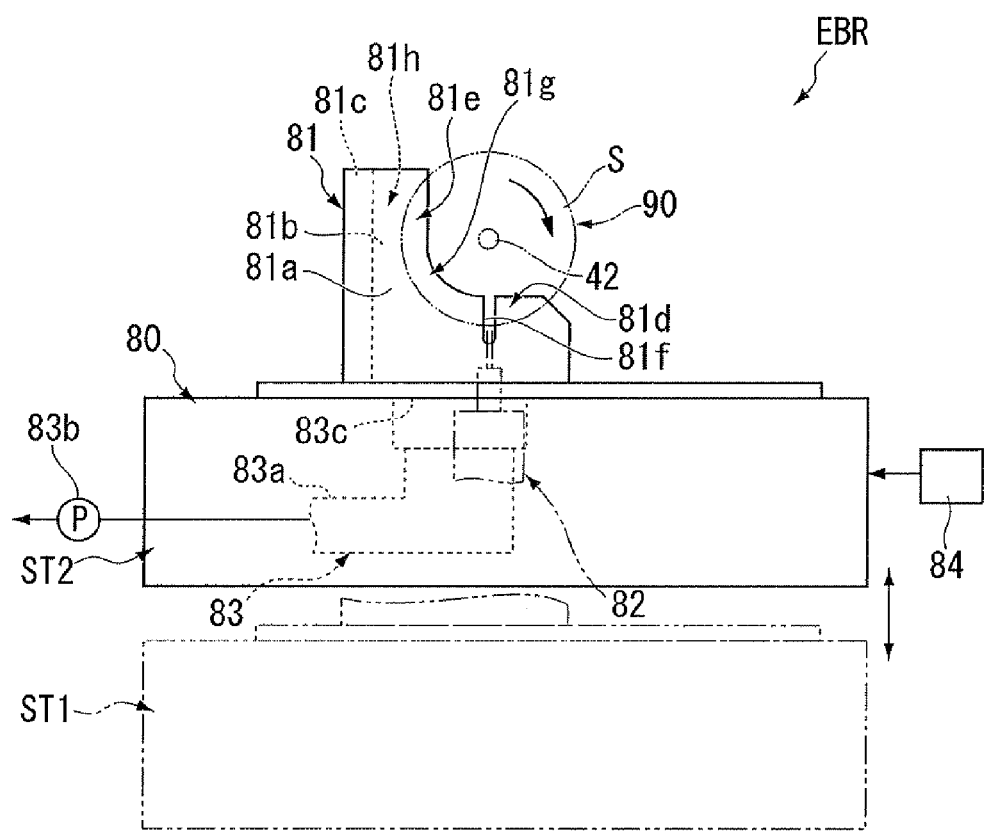
FIG. 18 is a diagram illustrating a configuration of the peripheral edge portion removal mechanism.
Figure 18:
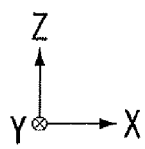
Figure 19:
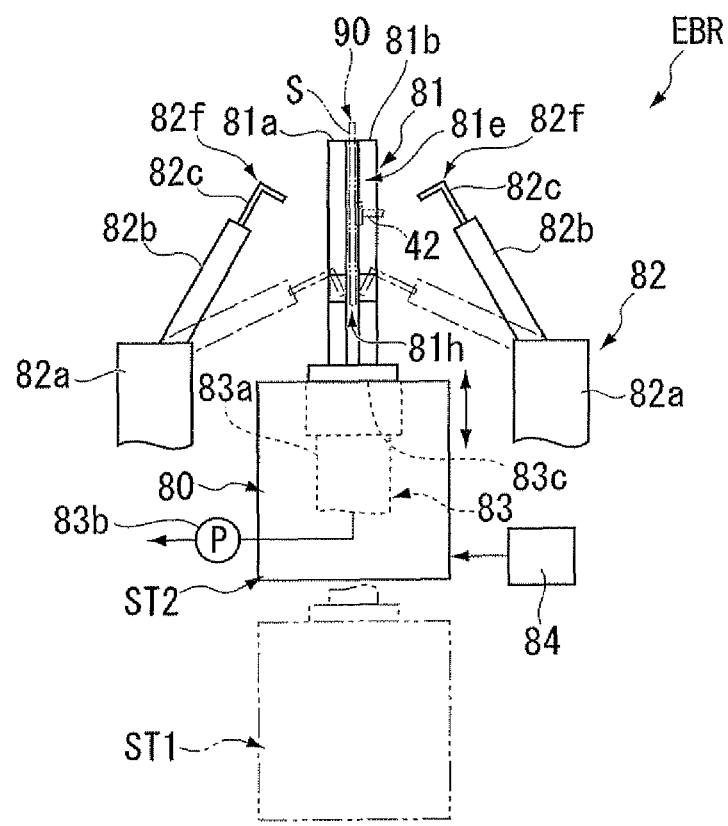
FIG. 19 is a diagram illustrating a configuration of the peripheral edge portion removal mechanism.

FIGS. 17 to 19 are diagrams illustrating the configuration of the peripheral edge portion removal mechanism EBR. FIG. 17 is a plan view, FIG. 18 is a front view, and FIG. 19 is a side view.

As shown in FIGS. 17 to 19, the peripheral edge portion removal mechanism EBR includes a stage 80, an accommodation mechanism 81, a cleaning liquid ejection mechanism 82, a suction mechanism 83, and a driving mechanism 84.

The stage 80 holds the accommodation mechanism 81, the cleaning liquid ejection mechanism 82, and the suction mechanism 83. The stage 80 is configured to be elevatable between a standby position ST1 and a process position ST2 (to be movable in the Z direction). The stage 80 is disposed at the standby position ST1 when the peripheral edge portion removal mechanism EBR is not operated and is disposed at the process position ST2 while the peripheral edge portion removal mechanism EBR is operated.

The accommodation mechanism 81 is disposed substantially at the center on the stage 80 when seen in the Z direction. The accommodation mechanism 81 accommodates part of the peripheral edge portion of the substrate S while the stage 80 is disposed at the process position ST2. The accommodation mechanism 81 includes a first plate-like portion 81a, a second plate-like portion 81b, and a connection portion 81c.

Each of the first plate-like portion 81a and the second plate-like portion 81b is a plate-like portion having the same shape and the same dimensions. Each of the first plate-like portion 81a and the second plate-like portion 81b is formed in an L-shape when seen in the Y direction. The first plate-like portion 81a and the second plate-like portion 81b are disposed to face each other so that a gap 81h accommodating the substrate S is formed therebetween. The connection portion 81c connects the end side of the −X side of the first plate-like portion 81a to the end side of the −X side of the second plate-like portion 81b.

The accommodation mechanism 81 includes an end portion accommodation portion 81d which accommodates the lower end portion (the −Z-side end portion) of the substrate S and a downstream accommodation portion 81e which accommodates the downstream of the lower end portion of the substrate S in the rotation direction. The end portion accommodation portion 81d is provided at the +Z side of a portion extending in the X direction among the first plate-like portion 81a and the second plate-like portion 81b. The end portion accommodation portion 81d and the downstream accommodation portion 81e include a portion overlapping with the substrate S in the first plate-like portion 81a and the second plate-like portion 81b when seen from the Y direction. The overlapping amount with the substrate S at the overlapping portion may be set to, for example, about 10 mm.

The end portion accommodation portion 81d is provided with a nozzle insertion portion 81f. The nozzle insertion portion 81f is formed from a position higher than the lower end portion of the substrate S accommodated in the end portion accommodation portion 81d to a position lower than the lower end portion of the substrate S in the Z direction.

For this reason, the accommodation mechanism 81 accommodates the substrate S while the lower end portion of the substrate S is exposed to the outside from the nozzle insertion portion 81f. A connection portion 81g connecting the end portion accommodation portion 81d and the downstream accommodation portion 81e to each other is curved along the shape of the outer periphery of the substrate S. For example, the end portion accommodation portion 81d and the downstream accommodation portion 81e are formed to cover at least two thirds from the lower end portion in the Z direction from the lower end portion of the substrate S in the Z direction. Of course, the end portion accommodation portion 81d and the downstream accommodation portion 81e may be formed to cover from the lower end portion of the substrate S to the upper end portion (the +Z-side end portion).

The cleaning liquid ejection mechanism 82 is provided for each of the +Y side and the −Y side of the accommodation mechanism 81. Each cleaning liquid ejection mechanism 82 supplies a cleaning liquid to the peripheral edge portion of the substrate S. Each cleaning liquid ejection mechanism 82 includes a base portion 82a, an arm 82b, and a cleaning liquid nozzle 82c. The base portion 82a includes, for example, a driving mechanism (not shown) rotating the arm 82b. By the driving mechanism, for example, as shown in FIG. 19, the arm 82b rotates in the θX direction.

When each arm 82b rotates in the clockwise direction and the counter-clockwise direction with respect to the θX direction, the cleaning liquid nozzle 82c is inserted into the nozzle insertion portion 81f of the accommodation mechanism 81. Further, when each arm 82b rotates in the clockwise direction and the counter-clockwise direction with respect to the θX direction, the cleaning liquid nozzle 82c inserted into the nozzle insertion portion 81f is separated therefrom.

The cleaning liquid nozzle 82c has the same shape as that of the nozzle 52. That is, the cleaning liquid nozzle 82c includes a bent portion 82f. The cleaning liquid nozzle 82c is formed to be bent at the bent portion 82f so as to eject the cleaning liquid from the center of the substrate S toward the outer peripheral side thereof while being inserted into the nozzle insertion portion 81f. Further, the ejection surface of the front end of the cleaning liquid nozzle 82c may be inclined with respect to the ejection direction of the cleaning liquid. In this case, since the front end of the cleaning liquid nozzle 82c is formed to be sharp, for example, it is possible to satisfactorily stop the supply of the cleaning liquid when the application of the cleaning liquid is stopped.

The suction mechanism 83 suctions the gap 81h formed between the first plate-like portion 81a and the second plate-like portion 81b in the accommodation mechanism 81. The suction mechanism 83 includes a suction pipe 83a which is disposed inside the stage 80 and a suction pump 83b which is connected to the suction pipe 83a. The suction pipe 83a includes a suction port 83c which is directed toward the accommodation mechanism 81. The suction port 83c is connected to the gap 81h.

By the suction mechanism 83, an air stream moving toward the −Z direction is formed in the gap 81h. For example, since the droplets of liquid material or the cleaning liquid scattered from the substrate S are apt to flow toward the −Z side by the air stream, scattering the liquid material or the cleaning liquid may be suppressed over the accommodation mechanism 81 in the +Z direction. The suction mechanism 83 suctions the gas inside the gap 81h or the removed liquid material and the cleaning liquid or the like discharged from the cleaning liquid nozzle 82c, and also serves as a discharge mechanism.

The driving mechanism 84 moves the stage 80 between the standby position ST1 and the process position ST2. The driving mechanism 84 includes, for example, an actuator mechanism such as a motor mechanism or an air cylinder mechanism (not shown). The driving mechanism 84 may include a guide portion or the like (not shown) guiding the stage 80.

(Substrate Unloading Unit)

Returning to FIGS. 1 to 3, the substrate unloading unit ULU is disposed at the +X side of the substrate processing unit SPU in the substrate processing system SYS. The substrate unloading unit ULU is a unit in which the unloading cassette C2 accommodating the processed substrate S is collected and to which the empty unloading cassette C2 is supplied. The portion of the substrate unloading unit ULU in the Y direction is formed as a long side, and unloading cassettes C2 may be disposed thereon in the Y direction.

The substrate unloading unit ULU includes a cassette entrance 60 and a cassette moving mechanism (a second moving mechanism) 61. The cassette entrance 60 is an opening portion which is provided at the −Y side of the cover member covering the substrate unloading unit ULU. The cassette entrance 60 is an entrance (a supply opening) of the empty unloading cassette C2 and is an exit (a collection opening) of the unloading cassette C2 accommodating the processed substrate S.

The cassette moving mechanism 61 includes, for example, a driving mechanism such as a belt conveyor mechanism. In the embodiment, a conveyor belt is provided as the driving mechanism. The conveyor belt extends from the +Y-side end portion of the substrate unloading unit ULU to the −Y-side end portion thereof in the Y direction, and two conveyor belts are disposed in the X direction.

The supply belt 61*a* is a conveyor belt which is disposed at the −X side among the two conveyor belts. The +Z side of the supply belt 61*a* is used as a carrying surface. The supply belt 61*a* is configured to rotate so that the carrying surface moves in the +Y direction. Unloading cassettes C2 entering the substrate unloading unit ULU through the cassette entrance 60 are placed on the carrying surface of the supply belt 61*a*. The unloading cassettes C2 are configured to move toward the carrying unit CRU through the rotation of the supply belt 61*a*.

The collecting belt 61*b* is a conveyor belt which is disposed at the +X side of the two conveyor belts. The +Z side of the collecting belt 61*b* is used as a carrying surface. The collecting belt 61*b* is configured to rotate so that the carrying surface moves in the −Y direction. The unloading cassettes C2 accommodating the processed substrate S is placed on the carrying surface of the collecting belt 61*b*.

The unloading cassette C2 is configured to move toward the cassette entrance 60 through the rotation of the collecting belt 61*b*.

In the embodiment, for example, the unloading cassette C2 may be disposed in a standby state at five standby positions (container standby portions) on each of the supply belt 61*a* and the collecting belt 61*b*. In the substrate unloading unit ULU, the standby position for the unloading cassette C2 may be moved by rotating the supply belt 61*a* and the collecting belt 61*b*, and the carrying time of the unloading cassette C2 may be shortened by moving the standby position.

(Carrying Unit)

The carrying unit CRU is disposed at an area along the end of the +Y side inside the substrate processing system SYS, and is configured to contact each of the substrate processing unit SPU, the substrate loading unit LDU, and the substrate unloading unit ULU. The carrying unit CRU carries the loading cassette C1 between the substrate processing unit SPU and the substrate loading unit LDU, and carries the unloading cassette C2 between the substrate processing unit SPU and the substrate unloading unit ULU. The carrying unit CRU includes a rail mechanism RL and a cassette carrying device CC.

The rail mechanism RL is fixed onto the stage unit STU, and extends in a linear shape from the −X-side end portion of the carrying unit CRU to the +X-side end portion thereof. The rail mechanism RL is a guide mechanism which guides the movement position of the cassette carrying device CC. The rail mechanism RL includes two rail members 70 which are disposed in parallel in the Y direction.

The cassette carrying device CC is provided on the two rail members 70 to pass over the two rail members 70 in the plan view. The cassette carrying device CC is a carrying device which accesses each of the buffer mechanism BF of the substrate processing unit SPU, the substrate loading unit LDU, and the substrate unloading unit ULU and holds and carries the loading cassette C1 and the unloading cassette C2. The cassette carrying device CC includes a movable member 71, a cassette support plate 72, a support plate rotation mechanism 73, a cassette holding member 74, a holding member elevation mechanism 75, and a holding member sliding mechanism 76.

The movable member 71 is formed in an H-shape in the plan view, and includes a concave portion 71*a* which is fitted to the two rail members 70. The movable member 71 includes, for example, a driving mechanism (a motor mechanism or the like) (not shown) therein. The movable member 71 is configured to be movable in a linear movement section along the rail members 70 by a driving force of the driving mechanism.

The cassette support plate 72 is a plate-like member which has a rectangular shape in the plan view and is fixed to the movable member 71. The cassette support plate 72 is formed to have a length larger than those of the bottom portions of the loading cassette C1 and the unloading cassette C2, and may stabilize the loading cassette C1 and the unloading cassette C2 while they are placed thereon. Since the cassette support plate 72 is fixed to the movable member 71, the cassette support plate 72 is configured to move together with the movable member 71.

The support plate rotation mechanism 73 is a rotation mechanism which rotates the cassette support plate 72 on the XY plane about the Z axis serving as the rotation axis. The support plate rotation mechanism 73 may change the length directions of the loading cassette C1 and the unloading cassette C2 placed on the cassette carrying device CC by rotating the cassette support plate 72.

The cassette holding member 74 is a holding member which is disposed at the +Y side of the cassette support plate 72 in the plan view and is formed in a U-shape in the plan view. The cassette holding member 74 is provided so that the position thereof in the X direction overlaps with the cassette support plate 72. The cassette holding member 74 is supported by the movable member 71 through a support member (not shown), and is configured to be movable together with the movable member 71. Both end portions of the U-shaped portion of the cassette holding member 74 are formed as a holding portion 74*a* which engages with the engagement portion Cx provided in the loading cassette C1 and the unloading cassette C2. The gap of the holding portion 74*a* (both end portions of the U-shaped portion) in the X direction is adjustable in accordance with the gap of the engagement portion Cx provided in the loading cassette C1 and the unloading cassette C2. The cassette holding member 74 may further reliably hold the loading cassette C1 and the unloading cassette C2 in the Z direction in a manner such that the holding portion 74*a* engages with the engagement portion Cx.

The holding member elevation mechanism 75 is a moving mechanism which is provided in the cassette holding member 74 and moves the cassette holding member 74 in the Z direction. As the holding member elevation mechanism 75, for example, a driving mechanism such as an air cylinder may be used. When the cassette holding member 74 is moved in the +Z direction by the holding member elevation mechanism 75, the loading cassette C1 and the unloading cassette C2 held by the cassette holding member 74 may be lifted. Conversely, when the cassette holding member 74 is moved in the −Z direction by the holding member elevation mechanism 75, the lifted cassette may be placed.

The holding member sliding mechanism 76 is a moving mechanism which is provided in the cassette holding member 74 and moves the cassette holding member 74 in the Y direction. The holding member sliding mechanism 76 includes a guide bar 76*a* which extends in the Y direction and a movable member 76*b* which moves along the guide bar 76*a*. The movable member 76*b* is fixed to the cassette holding member 74. When the movable member 76*b* moves along the guide bar 76*a* in the Y direction, the cassette holding member 74 moves together with the movable member 76*b* in the Y direction.

(Control Unit)

The control unit CNU is provided inside the stage unit STU of the substrate processing system SYS. The control unit CNU includes, for example, a control device controlling all operations of the units such as a substrate processing operation of the substrate processing unit SPU, a cassette movement operation of the substrate loading unit LDU or the substrate unloading unit ULU, and a carrying operation of the carrying unit CRU, and a supply source necessary for the materials of the units. As the supply source of the material, for example, a liquid material supply source, a cleaning liquid supply source, or the like may be mentioned.

Next, an operation of the substrate processing system SYS with the above-described configuration will be described. The operation performed in each unit of the substrate processing system SYS is controlled by the control unit CNU.

In the following description, the unit performing the operation is mainly described, but the operation is practically performed based on the control of the control unit CNU.

(Cassette Supply Operation)

First, a cassette supply operation will be described in which the loading cassette C1 accommodating the unprocessed substrate S is disposed at the substrate loading unit LDU, and the empty unloading cassette C2 is disposed at the substrate unloading unit ULU.

For example, the loading cassette C1 accommodating the unprocessed substrate S is supplied into the substrate loading unit LDU through the cassette entrance 10 by a supply mechanism or the like (not shown). The substrate loading unit LDU sequentially supplies the loading cassette C1 while rotating the supply belt 11a. By this operation, the loading cassettes C1 accommodating the unprocessed substrates S are disposed inside the substrate loading unit LDU.

On the other hand, for example, the empty unloading cassette C2 is supplied into the substrate unloading unit ULU through the cassette entrance 60 by the supply device or the like (not shown). The substrate unloading unit ULU sequentially supplies the unloading cassette C2 while rotating the supply belt 61a. By this operation, the empty unloading cassettes C2 are disposed inside the substrate unloading unit ULU.

(Cassette Carrying Operation)

Next, the loading cassettes C1 supplied to the substrate loading unit LDU and the unloading cassettes C2 supplied to the substrate unloading unit ULU are carried to each substrate processing unit SPU. This cassette carrying operation is performed by using the cassette carrying device CC provided in the carrying unit CRU.

The operation of carrying the loading cassette C1 will be described. The carrying unit CRU receives the loading cassette C1 by allowing the cassette carrying device CC to access the substrate loading unit LDU, and moves the cassette carrying device CC to the loading-side buffer mechanism BF1. After the movement of the cassette carrying device CC, the carrying unit CRU places the loading cassette C1 at the standby position P1 of the loading-side buffer mechanism BF1. After receiving the loading cassette, the substrate loading unit LDU moves the supply belt 11a, and entirely moves the other loading cassettes C1 in the +Y direction. Since the space at the −Y-side end portion on the supply belt 11a becomes empty due to the movement of the loading cassette C1, a new loading cassette C1 is supplied to the empty space by the supply device (not shown).

In the same manner, as for the operation of carrying the unloading cassette C2, the carrying unit CRU receives the unloading cassette C2 by allowing the cassette carrying device CC to access the substrate unloading unit ULU, and moves the cassette carrying device CC to the unloading-side buffer mechanism BF1. After the movement of the cassette carrying device CC, the carrying unit CRU places the unloading cassette C2 at the standby position P5 of the unloading-side buffer mechanism BF2. After receiving the unloading cassette, the substrate unloading unit ULU moves the supply belt 61a, and entirely moves the other unloading cassettes C2 in the +Y direction. Since the space of the −Y-side end portion on the supply belt 61a becomes empty due to the movement of the unloading cassette C2, a new unloading cassette C2 is supplied to the empty space by the supply device (not shown).

(Substrate Processing Operation)

Next, the processing operation at the substrate processing unit SPU will be described.

The substrate processing unit SPU performs an operation of moving the loading cassette C1 accommodating the unprocessed substrate S and the empty unloading cassette C2, an operation of loading the substrate S accommodated in the loading cassette C1, an operation of coating a liquid material onto the substrate S, a peripheral edge portion removal operation of removing the peripheral edge portion of the thin coating film formed on the substrate S, an operation of unloading the processed substrate S, an operation of moving the empty loading cassette C1 and the unloading cassette C2 accommodating the processed substrate S, a maintenance operation of the nozzle portion NZ, and a maintenance operation of the cup portion CP. In addition to each operation, the operation of carrying the substrate S is performed between the loading operation and the application operation, between the application operation and the peripheral edge portion removal operation, and between the peripheral edge portion removal operation and the unloading operation.

Among these operations, first, the operation of moving the loading cassette C1 and the unloading cassette C2 will be described. The substrate processing unit SPU moves the loading cassette C1 carried to the standby position P1 of the loading-side buffer mechanism BF1 to the standby position P2, and further moves the loading cassette C1 moved to the standby position P2 to the standby position P4.

The substrate processing unit SPU moves the cassette carrying arm 20b from the −Z side of the cassette placing member 20a toward the +Z side thereof while the loading cassette C1 is placed on the cassette placing member 20a provided at, for example, the standby position P1. By this operation, the cassette carrying arm 20b receives the loading cassette C1, so that the loading cassette C1 is lifted with respect to the cassette placing member 20a.

The substrate processing unit SPU moves the cassette carrying arm 20b receiving the loading cassette C1 in the +X direction, and stops the movement at the standby position P2. After the movement is stopped, the substrate processing unit SPU moves the cassette carrying arm 20b in the −Z direction of the cassette placing member 20a. By this operation, the cassette carrying arm 20b gives the loading cassette C1 to the cassette placing member 20a, and the cassette carrying arm 20b moves toward the −Z side of the cassette placing member 20a. In this manner, the loading cassette C1 is disposed at the standby position P2.

After the loading cassette C1 is moved from the standby position P1 to the standby position P2, the substrate processing unit SPU moves the cassette carrying arm 20b toward the −Z side of the cassette placing member 20a, and moves the cassette carrying arm 20b in the −X direction. By this operation, the cassette carrying arm 20b is returned to the original position (the standby position P1). At the same time, the substrate processing unit SPU moves the cassette carrying arm 20b disposed at the standby position P3 in the −X direction. By this operation, the cassette carrying arm 20b is disposed at the −Z side of the cassette placing member 20a of the standby position P2.

The substrate processing unit SPU moves the cassette placing member 20a to the standby position P4 while the loading cassette C1 is placed on the cassette placing member 20a at the standby position P2. By this operation, the loading cassette C1 moves from the standby position P2 to the standby position P4. In this case, only the cassette placing member 20a moves to the standby position P2 without moving the cassette carrying arm 20b disposed at the standby position P2. After the substrate S is processed at the standby position P4, the substrate processing unit SPU moves the cassette placing member 20a from the standby position P4 to the standby position P2. By this operation, the loading cassette C1 is returned to the standby position P2.

In the same manner, the substrate processing unit SPU moves the unloading cassette C2 carried to the standby position P5 of the unloading-side buffer mechanism BF2 to the standby position P6, and further moves the unloading cassette C2 moved to the standby position P6 to the standby position P8. By these operations, the loading cassette C1 and the unloading cassette C2 carried into the substrate processing unit SPU are disposed at a process start position.

Next, the operation of loading the substrate S will be described. After the substrate processing unit SPU confirms that the loading cassette C1 is disposed at the standby position P4, the upper substrate portion holding mechanism 23 is disposed at the clamping position, and the elevation member 24a of the lower substrate portion holding mechanism 24 is moved in the +Z direction. By this movement, the clamping member 24b attached to the +Z-side end portion of the elevation member 24a comes into contact with the -Z side of one substrate S disposed closest to the -Y side of the substrates S accommodated in the loading cassette C1, and the -Z side of the substrate S is held by the clamping member 24b.

After the -Z side of the substrate S is held, the substrate processing unit SPU further moves the elevation member 24a in the +Z direction while maintaining the holding state. By this movement, the substrate S is lifted toward the +Z side by the lower substrate portion holding mechanism 24, the +Z side of the substrate S comes into contact with the clamping member 23b of the upper substrate portion holding mechanism 23, and the +Z side of the substrate S is held by the clamping member 23b. The substrate S is held by both the clamping member 23b of the upper substrate portion holding mechanism 23 and the clamping member 24b of the lower substrate portion holding mechanism 24.

The substrate processing unit SPU simultaneously moves the elevation member 23a and the elevation member 24a in the +Z direction while holding the substrate S by the clamping member 23b and the clamping member 24b.

The substrate processing unit SPU synchronizes the movements of the elevation mechanism 23c and the elevation mechanism 24c so that the elevation member 23a and the elevation member 24a move at the same speed. The substrate S moves in the +Z direction while being held by the clamping member 23b and the clamping member 24b. When the substrate S is disposed at the loading position LP, the substrate processing unit SPU stops the movements of the elevation member 23a and the elevation member 24a. In this manner, the operation of loading the substrate S is performed.

After the loading operation, the substrate processing unit SPU allows the holding portion 32 of the loading-side carrying mechanism SC1 to access the loading position LP, and holds the substrate S disposed at the loading position LP by the holding portion 32. When the holding portion 32 is allowed to access the loading position LP, the substrate processing unit SPU rotates the rotation table 30b to direct the front end surface 31b of the arm portion 31 toward the +Y side and drives the motor device 35a to move the arm portion 31 in the Y direction. In accordance with the movement of the arm portion 31, the holding portion 32 attached to the front end surface 31b of the arm portion 31 accesses the loading position LP.

After the holding portion 32 accesses the loading position, the substrate processing unit SPU operates the suction pump 34a to suction and hold the substrate S via the holding portion 32. By this operation, the substrate S is held upright in the Z direction by the holding portion 32. After the substrate S is held upright by the holding portion 32, the substrate processing unit SPU releases the holding force using the clamping member 23b and the clamping member 24b and allows the substrate S to be held by only the holding portion 32. In this state, the substrate processing unit SPU releases the holding force to retreat the clamping member 23b and the clamping member 24b in the -Z direction. After the clamping members 23b and 24b retreat, the substrate processing unit SPU rotates the rotation table 30b of the loading-side carrying mechanism SC1, and carries the substrate S to the application position inside the application mechanism CT while the substrate S is held upright in the Z direction.

Next, the operation of coating the liquid material onto the substrate S will be described. In this application operation, the application mechanism CT is used. The substrate processing unit SPU rotates the substrate S at a high speed while the substrate S is held upright in the Z direction, and allows the nozzle 52 provided in the application mechanism CT to access the application position 50 so that the liquid material is ejected from the nozzle 52 onto the substrate S.

Specifically, the substrate processing unit SPU operates the motor device 33a while the substrate S is disposed at the application position 50. By the action of the motor device 33a, the rotation shaft member 33b rotates, and the holding portion 32 held by the rotation shaft member 33b rotates together with the rotation shaft member 33b. By this operation, the substrate S rotates while being upright in the Z direction. The substrate processing unit SPU rotates the rotation shaft member 33b (the holding portion 32 and the substrate S) at, for example, 5000 rpm or more.

After the substrate S rotates while being upright in the Z direction, the substrate processing unit SPU allows the nozzles 52 at the +X side and the -X side of the application position 50 to access each substrate S, and ejects the liquid material from the nozzles 52 to the first surface and the second surface of the substrate S. The ejected liquid material is widely spread up to the outer periphery of the substrate S by the centrifugal force of the rotation, so that the thin coating film is formed on both surfaces of the substrate S.

Since each nozzle 52 is disposed at the -Z side of the rotation axis of the substrate S, the nozzle 52 is disposed without contacting the holding portion 32 or the arm portion 31. Furthermore, since each nozzle 52 ejects the liquid material from the rotation axis of the substrate S toward the outer periphery of the substrate S, the movement of the liquid material toward the center of the substrate S is suppressed.

The substrate processing unit SPU rotates the inner cup CP1 when coating the liquid material while rotating the substrate S. By the rotation of the substrate S, the liquid material scattered over the substrate S after the liquid material is ejected onto the substrate S is accommodated in the accommodation portion 53 through the opening portion formed in the facing portion 53a of the inner cup CP1. In the inside of the accommodation portion 53, the streams of the gas and the liquid material are generated in the rotation direction of the inner cup CP1 due to the rotation thereof. The liquid material and the gas are discharged to the discharge path through the discharge mechanism 54 connected to the outer cup CP2 along the streams. The liquid material and the gas discharged to the discharge path are separated from each other by the trap mechanism 55 so that the gas passes the inside of the trap mechanism 55 and the liquid material remains inside the trap mechanism 55. The liquid material remaining inside the trap mechanism 55 is discharged through a discharge portion (not shown).

After the application operation, the substrate processing unit SPU allows the holding portion 42 of the unloading-side carrying mechanism SC2 to access the substrate S inside the application mechanism CT from the +X side thereof, and holds the substrate S by the holding portion 42. The operation of holding the substrate S using the holding portion 42 is the same as the operation of holding the substrate S using the holding portion 32. By this operation, one surface of the substrate S is held by the holding portion 32 of the loading-side carrying mechanism SC1, and the other surface of the substrate S is held by the holding portion 42 of the unloading-side carrying mechanism SC2.

After the substrate S is held by the holding portion 42, the substrate processing unit SPU stops the operation of the suction pump 34a to release the holding operation of the holding portion 32. By this operation, the substrate S is held by only the holding portion 42 of the unloading-side carrying mechanism SC2, and the substrate S is transferred between the loading-side carrying mechanism SC1 and the unloading-side carrying mechanism SC2.

Next, the peripheral edge portion removal operation of removing the thin coating film formed on the periphery of the substrate S will be described. In the peripheral edge portion removal operation, the peripheral edge portion removal mechanism EBR is used. After the substrate S is transferred therebetween, the substrate processing unit SPU rotates the rotation table 40b so that the holding portion 42 is directed toward the peripheral edge portion removal mechanism EBR (the −Y direction), and appropriately extends the arm portion 41 so that the substrate S is disposed at the holding position 90.

After the substrate S is disposed at the holding position 90, the substrate processing unit SPU moves the stage 80 from the standby position ST1 to the process position ST2. Since the stage 80 is disposed at the process position ST2, part of the peripheral edge portion of the substrate S is accommodated in the end portion accommodation portion 81d and the downstream accommodation portion 81e of the accommodation mechanism 81. Specifically, part of the peripheral edge portion of the substrate S is disposed between the first plate-like portion 81a and the second plate-like portion 81b, and a gap (81h) is formed between the substrate S and the first plate-like portion 81a, between the substrate S and the second plate-like portion 81b, and between the substrate S and the connection portion 81c.

After the stage 80 is disposed at the process position S2, the substrate processing unit SPU rotates the arm 82b of the cleaning liquid ejection mechanism 82 so that the cleaning liquid nozzle 82c is inserted into the nozzle insertion portion 81f of the end portion accommodation portion 81d. This operation is performed in each of the cleaning liquid ejection mechanisms 82 disposed at both sides of the first surface Sa and the second surface Sb of the substrate S. By this operation, the front end of the cleaning liquid nozzle 82c is directed toward the lower end portion (the −Z side end portion) of the first surface Sa and the second surface Sb of the substrate S in the drawing.

After the cleaning liquid nozzle 82c is disposed at the nozzle insertion portion 81f, the substrate processing unit SPU operates a motor device 43a of the unloading-side carrying mechanism SC2. By the action of the motor device 43a, the rotation shaft member 43b rotates, and the holding portion 42 held by the rotation shaft member 43b rotates together with the rotation shaft member 43b. At this time, the substrate processing unit SPU rotates the rotation shaft member 43b (the holding portion 42 and the substrate S) at, for example, 1500 rpm or less which is lower than the rpm during the application operation. Further, the substrate processing unit SPU controls the rotational driving of the motor device 43a so that the substrate S rotates in the clockwise direction when seen in the +Y direction in the state shown in FIG. 18. The substrate processing unit SPU ejects the cleaning liquid from the cleaning liquid nozzle 82c while the substrate S rotates. The substrate processing unit SPU simultaneously ejects the cleaning liquid from, for example, the cleaning liquid nozzles 82c disposed at both sides of the first surface Sa and the second surface Sb of the substrate S.

For example, the ejection start timing of the cleaning liquid nozzles 82c at both sides may be different for each of the cleaning liquid nozzles 82c.

The cleaning liquid ejected from the cleaning liquid nozzle 82c is supplied to the lower end portion of the rotating substrate S.

The liquid thin coating film formed at the lower end portion of the substrate S is melted and removed by the cleaning liquid. By the driving of the motor device 43a, the lower end portion of the substrate S receiving the cleaning liquid moves to the downstream accommodation portion 81e. The cleaning liquid or the liquid thin coating film attached to the rotating substrate S is apt to fly along, for example, the rotation direction of the substrate S. Conversely, in the embodiment, since the accommodation mechanism 81 continuously accommodates the substrate S from the end portion accommodation portion 81d to the downstream accommodation portion 81e, the accommodation mechanism may accommodate the scattered cleaning liquid or the scattered liquid material.

The substrate processing unit SPU operates the suction mechanism 83 when ejecting the cleaning liquid.

By this operation, the space on the suction port 83c is suctioned, so that an air stream is formed in, for example, the gap 81h to move in the −Z direction. As for the start time of the suction operation, for example, the start time of the suction operation may be any time before the cleaning liquid is ejected to the substrate S. By the suction operation, an air stream is generated in the −Z direction at the space (the gap 81h) around the rotating substrate S toward the suction port 83c. For this reason, for example, the droplets of the liquid material or the cleaning liquid scattered from the substrate S flow to the suction port 83c by the air stream, and scattering the liquid material or the cleaning liquid is suppressed over the accommodation mechanism 81 in the +Z direction.

The droplets of the liquid material or the cleaning liquid suctioned from the suction port 83c are collected through, for example, the suction pipe 83a. When the substrate S rotates, for example, once, the cleaning liquid is supplied to the entire thin coating film of the liquid material formed on the peripheral edge portion of the substrate S. In the embodiment, the thin coating film formed on the peripheral edge portion of the substrate S is removed by rotating the substrate S one or more times while the cleaning liquid is supplied to the lower end portion of the substrate S.

The rpm of the substrate S or the amount of the cleaning liquid discharged from the cleaning liquid nozzle 82c may be set in advance by performing, for example, a test or a simulation, and may be changed while the substrate S rotates or the cleaning liquid is discharged. Further, the operation of rotating the substrate S and the operation of coating the cleaning liquid may be set to respectively have limitation times in advance and the operations may be finished after the limitation times are over.

When the operation of removing the peripheral edge portion of the substrate S is finished, the substrate processing unit SPU stops the supply of the cleaning liquid from the cleaning liquid nozzle 82c and stops the rotation of the substrate S. Further, at this time, the operation of the suction mechanism 83 may be stopped. After the operations are stopped, the substrate processing unit SPU moves the stage 80 from the process position ST2 to the standby position ST1. By this operation, the accommodation mechanism 81 is retreated from the periphery of the substrate S so that the entire surface of the substrate S is exposed.

After the stage 80 is moved to the standby position ST1, the substrate processing unit SPU appropriately shortens the arm portion 41 to return the substrate S to the holding position 90. Subsequently, the substrate processing unit SPU moves the elevation member 25a so that the clamping member 25b of the upper substrate portion holding mechanism 25 is located at the +Z side of the unloading position UP. After the movement of the elevation member 25a, the substrate processing unit SPU rotates the rotation table 40b to direct the holding portion 42 toward the unloading position UP (the +Y direction) and appropriately extends or shortens the arm portion 41 to allow the holding portion 42 to access the unloading position UP. By this operation, the substrate S is disposed at the unloading position UP.

Next, the operation of unloading the substrate S will be described. After it is confirmed that the substrate S is disposed at the unloading position UP, the substrate processing unit SPU moves the elevation member 25a of the upper substrate portion holding mechanism 25 in the −Z direction and moves the elevation member 26a of the lower substrate portion holding mechanism 26 in the +Z direction. By this movement, the clamping member 25b attached to the −Z side of the elevation member 25a comes into contact with the +Z side of the substrate S, the clamping member 26b attached to the +Z-side end portion of the elevation member 26a comes into contact with the −Z side of the substrate S, and the +Z side and the −Z side of the substrate S are respectively held by the clamping member 25b and the clamping member 26b.

After it is confirmed that the substrate S is held by both the clamping member 25b and the clamping member 26b, the substrate processing unit SPU stops the operation of the suction pump 44a of the unloading-side carrying mechanism SC2 and releases a state where the substrate S is held by the holding portion 42. By this operation, the substrate S is held by only the clamping member 25b and the clamping member 26b. The substrate processing unit SPU simultaneously moves the elevation member 25a and the elevation member 26a in the −Z direction while the substrate S is held by the clamping member 25b and the clamping member 26b. The substrate processing unit SPU synchronizes the movements of the elevation mechanism 25c and the elevation mechanism 26c so that the elevation member 25a and the elevation member 26a move at the same speed. The substrate S moves in the −Z direction while being held by the clamping member 25b and the clamping member 26b.

When the protrusion portion of the elevation member 25a becomes close to the unloading cassette C2, the substrate processing unit SPU releases the holding force using the clamping member 25b and moves only the elevation member 26a in the −Z direction by stopping the movement of the elevation member 25a. The substrate S moves in the −Z direction while being held by only the holding force of the clamping member 26b.

The substrate processing unit SPU keeps the holding operation of the clamping member 26b until the substrate S reaches the accommodation position inside the unloading cassette C2. After the substrate S reaches the accommodation position, the substrate processing unit SPU releases the holding operation of the clamping member 26b and moves the elevation member 26a in the −Z direction. By this operation, the substrate S is accommodated in the unloading cassette C2.

In the description of the operations, the operations are sequentially performed on one substrate S located closest to the −Y side of the substrates S accommodated in the loading cassette C1, but in fact, the operations are continuously performed on multiple substrates S. In this case, the substrate processing unit SPU moves the cassette placing member 20a in the −Y direction so that the substrate S located closest to the −Y side of the other substrates S accommodated in the loading cassette C1 overlaps the loading position LP in the plan view while the loading cassette C1 is placed thereon.

In the same manner, the substrate processing unit SPU moves the cassette placing member 20a in the −Y direction so that the accommodation position closest to the −Y side among the accommodation positions inside the unloading cassette C2 overlaps with the unloading position UP in the plan view while the unloading cassette C2 is placed thereon. The substrate processing unit SPU repetitively performs the operations while moving the loading cassette C1 and the unloading cassette C2 as described above.

When the process is performed in parallel on the substrates S, the substrate processing unit SPU performs the process in parallel on the substrates S. Specifically, the process is performed on the substrates S in a manner such that the peripheral edge portion removal operation is performed on one substrate S while the application operation is performed on another substrate S and other substrates S are loaded or unloaded. When the process is performed in parallel in this manner, it is possible to maximally shorten the standby time of the substrate S and to shorten the process tact time of the substrate S.

When the process of all substrates S accommodated inside the loading cassette C1 is completed, the loading cassette C1 becomes empty, and all accommodation positions of the unloading cassette C2 waiting at the standby position P8 are filled with the processed substrates S. After this state is confirmed by the substrate processing unit SPU, the substrate processing unit SPU moves the cassette placing member 20a in the reversed direction (in the +Y direction) and moves the loading cassette C1 from the standby position P4 to the standby position P2. Further, the substrate processing unit SPU moves the loading cassette C1 moved to the standby position P2 to the standby position P3 by using the carrying arm 20b.

In the same manner, the substrate processing unit SPU moves the cassette placing member 20a in the reverse direction (the +Y direction) and moves the unloading cassette C2 from the standby position P8 to the standby position P6.

Further, the substrate processing unit SPU moves the unloading cassette C2 moved to the standby position P6 to the standby position P7 by using the carrying arm 20b.

Next, the operation of performing the maintenance of the nozzle portion NZ and the cup portion CP of the application mechanism CT will be described. When the application operation is performed multiple times, an impurity such as a solidified material of the liquid material or dust in the atmosphere is attached to the nozzle portion NZ or the cup portion CP. For example, the impurity may block the nozzle 52 to degrade the ejection characteristics or block the discharge path inside the cup portion CP. Further, in the ejection operation, the ejection environment of the nozzle 52 needs to be managed so that it is not changed. Accordingly, it is necessary to periodically perform the maintenance operation of the nozzle portion NZ and the cup portion CP.

In the operation of performing the maintenance of the nozzle portion NZ, the nozzle managing mechanism NM is used. When the nozzle 52 is cleaned, the substrate processing unit SPU moves the nozzle portion NZ so that the nozzle 52 accesses the nozzle managing mechanism NM. The substrate processing unit SPU fits the nozzle 52 into the nozzle locking portion 57a corresponding to the impregnation portion 57. By this operation, the front end portion of the nozzle 52 is impregnated with the impregnation liquid Q inside the impregnation liquid storage portion 57b. For this reason, the front end portion of the nozzle 52 is moisturized by the impregnation liquid Q.

After the front end portion of the nozzle 52 is impregnated with the impregnation liquid, the substrate processing unit SPU separates the nozzle 52 fitted to the nozzle locking portion 57a and moves the nozzle 52 to the discharge portion 58. The substrate processing unit SPU fits the moved nozzle 52 to the nozzle locking portion 58a corresponding to the discharge portion 58. By this operation, the front end portion of the nozzle 52 is inserted into the discharge passage 58c. In this state, the substrate processing unit SPU operates the suction mechanism 58b. By the operation of the suction mechanism 58b, the discharge passage 58c and the impregnation liquid storage portion 57b communicating with the discharge passage 58c are suctioned. By the suction operation, the impurity such as the cleaning liquid remaining in the nozzle 52 is removed.

After the suction operation, the nozzle 52 fitted to the nozzle locking portion 58a is separated, and the nozzle 52 is moved to the preliminary ejection portion 59. The substrate processing unit SPU fits the moved nozzle 52 to the nozzle locking portion 59a corresponding to the preliminary ejection portion 59. Next, the substrate processing unit SPU operates the drain mechanism 59d and the suction mechanism 59f and ejects the liquid material from the +Y-side end portion of the preliminary ejection member 59b of the preliminary ejection portion 59 into the drain passage 59c. In this state, the substrate processing unit SPU preliminarily ejects the liquid material from the nozzle 52 to the preliminary ejection member 59b. Subsequently, the substrate processing unit SPU cleans the preliminary ejection member 59b. By the series of preliminary ejection operations of the nozzle 52, the ejection environment of the nozzle 52 is adjusted.

Next, the operation of performing the maintenance of the cup portion CP will be described. When the cup portion CP is cleaned, the second nozzle 56 is used. The substrate processing unit SPU allows the second nozzles 56 to access the +X side and the −X side of the substrate S instead of the nozzles 52 while the substrate S rotates when performing the application operation, and ejects the cleaning liquid from each second nozzle 56 to the substrate S. The cleaning liquid ejected onto the substrate S moves to the peripheral edge portion of the substrate S due to the centrifugal force of the rotation, and is scattered from the peripheral edge portion of the substrate S toward the inner cup CP1. The scattered cleaning liquid is accommodated inside the accommodation portion 53 through the opening portion of the facing portion 53a. At this time, the substrate processing unit SPU may form a stream of the cleaning liquid inside the accommodation portion 53 by rotating the inner cup CP1 and cleaning the inside of the accommodation portion 53 and the discharge path by the stream of the cleaning liquid. Similarly to the liquid material, the cleaning liquid is discharged so that the gas and the liquid are separated from each other at the trap mechanism 55.

For example, the operation of cleaning the cup portion CP may be performed while the facing portion 53a of the accommodation portion 53 is separated. Additionally, at the time other than the cleaning operation, for example, the facing portion 53a may be separated to separately clean the facing portion 53a, or the facing portion 53a may be separated to perform the maintenance of other portions of the cup portion CP.

(Cassette Carrying Operation)

Next, the cassette carrying operation will be described which carries the empty loading cassette C1 to the substrate loading unit LDU and carries the unloading cassette C2 accommodating the processed substrate S to the substrate unloading unit ULU.

The operation of carrying the loading cassette C1 will be described. The carrying operation is performed by using the cassette carrying device CC that is used for the above-described carrying operation. The carrying unit CRU moves the cassette carrying device CC up to the loading-side buffer mechanism BF1 of the substrate processing unit SPU, and receives the empty loading cassette C1 waiting at the standby position P3 by using the cassette carrying device CC.

After the loading cassette C1 is received, the carrying unit CRU moves the cassette carrying device CC toward the substrate loading unit LDU in the −X direction. After the movement, the carrying unit CRU places the empty loading cassette C1 placed on the cassette support plate 72 on the +Y-sided end portion of the collecting belt 11b, and retreats the cassette holding member 74 to the +Y side.

The operation of carrying the unloading cassette C2 will be described. The carrying operation is performed by using the cassette carrying device CC as in the operation of carrying the loading cassette C1. The carrying unit CRU moves the cassette carrying device CC up to the unloading-side buffer mechanism BF2 of the substrate processing unit SPU in the X direction, and receives the unloading cassette C2 waiting at the standby position P7 by using the cassette carrying device CC.

After the unloading cassette C2 is received, the carrying unit CRU moves the cassette carrying device CC toward the substrate unloading unit ULU in the +X direction. After the movement, the carrying unit CRU places the unloading cassette C2 placed on the cassette support plate 72 on the +Y-side end portion of the collecting belt 61b, and retreats the cassette holding member 74 to the +Y side.

(Cassette Collecting Operation)

Next, the operation of collecting the empty loading cassette C1 and the unloading cassette C2 accommodating the processed substrate S will be described.

After the substrate loading unit LDU confirms that the empty loading cassette C1 is carried thereto, the substrate loading unit LDU rotates the collecting belt 11b and carries the loading cassette C1 to the outside of the substrate loading unit LDU through the cassette entrance 10. This operation is repeated when the loading cassette C1 is carried to the substrate loading unit LDU.

In the same manner, after the substrate unloading unit ULU confirms that the unloading cassette C2 accommodating the processed substrate S is carried thereto, the substrate unloading unit ULU rotates the collecting belt 61b to move in the −Y direction and carries the unloading cassette C2 to the outside of the substrate unloading unit ULU through the cassette entrance 60. This operation is repeated when the unloading cassette C2 is carried to the substrate unloading unit ULU.

(Cassette Supplementing Operation)

After the carrying unit CRU confirms that the standby position P1 and the standby position P5 are empty, the carrying unit CRU carries the next loading cassette C1 and the next unloading cassette C2 to the standby position P1 and the standby position P5 by using the cassette carrying device CC. First, the carrying unit CRU moves the cassette carrying device CC up to the substrate loading unit LDU to receive the next loading cassette C1. After the loading cassette C1 is received, the carrying unit CRU moves the cassette carrying device CC up to the loading-side buffer mechanism BF1 and places the received loading cassette C1 at the standby position P1. In the same manner, the carrying unit CRU moves the cassette carrying device CC to the substrate unloading unit ULU to receive the next unloading cassette C2, and then moves the cassette carrying device CC to the unloading-side buffer mechanism BF2 to place the unloading cassette C2 at the standby position P5.

For example, when the loading cassette C1 moves from the standby position P1 to the standby position P2 and the unloading cassette C2 moves from the standby position P5 to the standby position P6 upon performing the application operation, the standby position P1 and the standby position P5 become empty again. The next loading cassette C1 and the next unloading cassette C2 may be carried to wait at the empty standby position P1 and the empty standby position P5. In this manner, whenever the standby position P1 and the standby position P5 of the loading-side buffer mechanism BF1 and the unloading-side buffer mechanism BF2 become empty, the carrying unit CRU carries the loading cassette C1 from the substrate loading unit LDU and carries the unloading cassette C2 from the substrate unloading unit ULU.

As described above, according to the embodiment, the application mechanism CT is provided at the application position (the first position) 50 where the substrate S is disposed by the substrate carrying mechanism SC, and the peripheral edge portion removal mechanism EBR is provided at the holding position (the second position) 90. Therefore, it is possible to independently set the process environment of the application mechanism CT and the process environment of the peripheral edge portion removal mechanism EBR. For this reason, it is not necessary to adjust the environment around the substrate S for each process, and it is possible to prevent a degradation of the throughput. Further, since the operation of ejecting the cleaning liquid to the substrate S is performed at the outside of the cup portion CP, it is possible to maintain the inside of the cup portion CP to be clean.

Further, according to the embodiment, since the peripheral edge portion removal mechanism EBR is provided with the suction mechanism 83, it is possible to prevent scatter of the removed liquid material. Accordingly, it is possible to prevent a change in the environment around the substrate S in the peripheral edge portion removal mechanism EBR. Since the suction mechanism 83 is provided with the suction port 83c directed toward the lower end portion of the substrate S, it is possible to prevent the removed liquid material from rising. Further, since the peripheral edge portion removal mechanism EBR is provided with the driving mechanism 84 elevating the accommodation mechanism 81, it is possible to elevate the accommodation mechanism 81 in accordance with the position of the substrate S. Accordingly, it is possible to smoothly perform a series of operations in which the substrate S is carried to the peripheral edge portion removal mechanism EBR, the substrate S is processed, and the substrate S is carried to the other units.

Further, according to the embodiment, the cleaning liquid ejection mechanism 82 includes the cleaning liquid nozzle 82c ejecting the cleaning liquid, it is possible to efficiently remove the liquid material attached to the peripheral edge portion of the substrate S. Further, since the cleaning liquid nozzle 82c is formed to be bent to eject the cleaning liquid from the center of the substrate S toward the outer peripheral portion of the substrate S, the ejection direction of the cleaning liquid nozzle 82c is aligned with the direction of the centrifugal force acting on the substrate S. Accordingly, since it is possible to remove the cleaning liquid by moving the cleaning liquid toward the outer periphery of the substrate, it is possible to prevent the cleaning liquid or the removed liquid material from being attached to the center of the substrate S.

Further, according to the embodiment, since the accommodation mechanism 81 includes the end portion accommodation portion 81d accommodating the lower end portion of the substrate S and the downstream accommodation portion 81e accommodating the downstream of the substrate in the rotation direction thereof rather than the lower end portion of the substrate S, it is possible to prevent scatter of the cleaning liquid or the removed liquid material at the lower end portion of the substrate S and the downstream of the substrate S in the rotation direction thereof rather than the lower end portion.

Further, since the end portion accommodation portion 81d includes the nozzle insertion portion 81f, for example, the cleaning liquid nozzle 82c may be moved closer to the substrate S. Accordingly, it is possible to improve the process precision.

The technical scope of the invention is not limited to the above-described embodiment, but may be appropriately modified within a scope not departing from the spirit of the invention.

Figure 20:
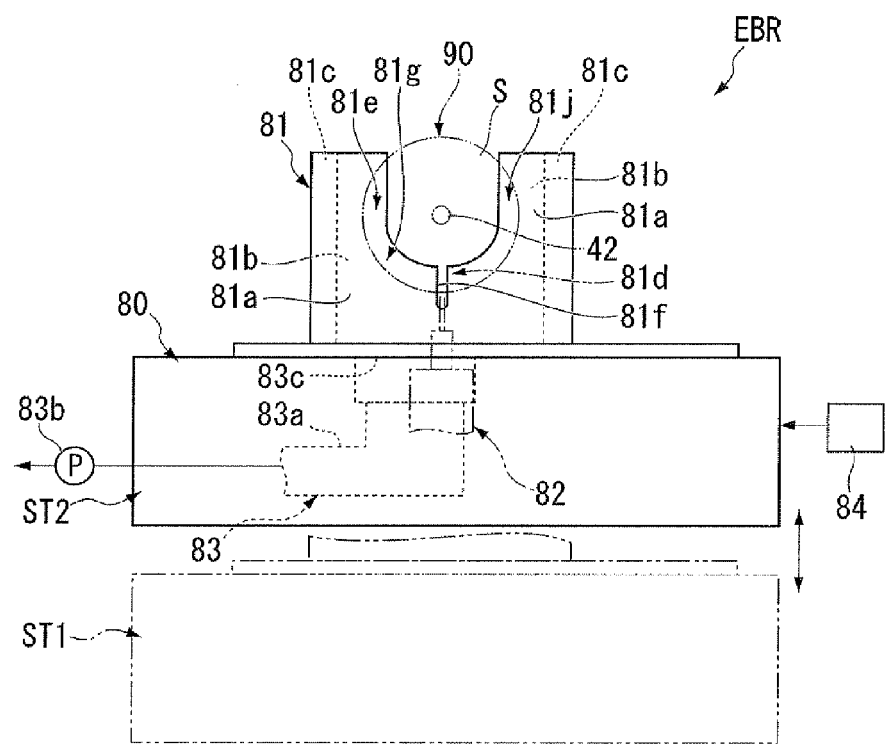
FIG. 20 is a diagram illustrating another configuration of the peripheral edge portion removal mechanism.

For example, in the above-described embodiment, a configuration has been described in which the accommodation mechanism 81 includes the end portion accommodation portion 81d and the downstream accommodation portion 81e, but the invention is not limited thereto. For example, as shown in FIG. 20, the accommodation mechanism 81 may include an upstream accommodation portion 81j which accommodates the upstream of the substrate S in the rotation direction of the substrate S rather than the lower end portion of the substrate S. In FIG. 20, the upstream accommodation portion 81j and the downstream accommodation portion 81e are formed to be symmetrical to each other with the nozzle insertion portion 81f interposed therebetween, but the invention is not limited thereto. For example, the length of the upstream accommodation portion 81j in the Z direction may be different from that of the downstream accommodation portion 81e. Therefore, even in the upstream of the substrate S in the rotation direction thereof rather than the lower end portion of the substrate S, it is possible to prevent scatter of the liquid material or the cleaning liquid.

Further, in the above-described embodiment, as the configuration of supplying the cleaning liquid to the substrate S, a configuration in which the cleaning liquid nozzle 82c is provided has been mentioned, but the invention is not limited thereto. For example, a configuration may be adopted in which a dip portion immersing the substrate S in an area filled with the cleaning liquid may be provided. In this case, the entire peripheral edge portion of the substrate S may be immersed into the cleaning liquid by rotating the substrate S.

Further, in the above-described embodiment, a second nozzle 56 is provided as a nozzle ejecting the cleaning liquid cleaning the cup portion CP, but the invention is not limited thereto. For example, the nozzle 52 may also be used as the cleaning liquid nozzle. In this case, a switching mechanism (not shown) may be provided to switch the supply source of the nozzle 52 to the liquid material or the cleaning liquid. Accordingly, it is possible to efficiently perform the maintenance without complicating the configuration of the device.

Further, in the above-described embodiment, the position of the nozzle portion NZ is disposed at the −Z side of the rotation axis of the substrate S, and the liquid material is ejected along the direction of gravity. However, the invention is not limited thereto. For example, a configuration may be adopted in which the position of the nozzle portion NZ is disposed at the +Z side of the rotation axis of the substrate S, and the liquid material is ejected in the direction opposite to the direction of gravity.

Further, in the above-described embodiment, the nozzle 52, the second nozzle 56, and the cleaning liquid nozzle 82c are bent, but the invention is not limited thereto. For example, the nozzle 52, the second nozzle 56, and the cleaning liquid nozzle 82c may be curved toward the −Z side of the rotation axis of the substrate S. Accordingly, it is possible to smoothly circulate the liquid material.

Further, in the above-described embodiment, a configuration has been described in which the nozzles 52 are disposed at the same position in the first surface and the second surface of the substrate S, but the invention is not limited thereto. For example, the nozzles 52 may be disposed at different positions in the first surface and the second surface. For example, the nozzle 52 may be disposed at the −Z side of the rotation axis of the substrate S at the +X side of the application position 50, and the nozzle 52 may be disposed at the +Z side of the rotation axis of the substrate S at the −X side of the application position 50. Of course, the arrangement at the +Z side and the −Z side may be reversed. The second nozzles 56 and the cleaning liquid nozzles 82c may have the same configuration.

Further, in the above-described embodiment, a configuration has been described in which the nozzle managing mechanism NM is disposed at the +Y side of each nozzle portion NZ, but the invention is not limited thereto. For example, the nozzle managing mechanism NM may be disposed at a different position if the nozzle portion NZ is within a movable range.

Further, in the above-described embodiment, a configuration has been described in which the substrate carrying mechanism SC is disposed at two positions inside the substrate processing unit SPU, but the invention is not limited thereto. For example, the substrate carrying mechanism SC may be disposed at one position or be disposed at three or more positions.

Further, in the above-described embodiment, a configuration has been described in which the substrate loading unit LDU includes a belt conveyor mechanism as the cassette moving mechanism 11, but the invention is not limited thereto. Instead of the belt conveyor mechanism, for example, a fork member holding the engagement portion Cx of the loading cassette C1 may be provided. For example, the fork member may have the same configuration as that of the cassette holding member 74 of the cassette carrying device CC. The engagement portion Cx of the loading cassette C1 held by the fork member may move inside the substrate loading unit LDU. The fork member may also be used as the cassette moving mechanism 61 of the substrate unloading unit ULU.

Further, in the above-described embodiment, a configuration has been described in which the cassette placing members 20a and 22a and the carrying arms 20b and 22b are used as the mechanisms moving the loading cassette C1 and the unloading cassette C2 at the standby positions in the loading-side buffer mechanism BF1 and the unloading-side buffer mechanism BF2, but the invention is not limited thereto. For example, the conveyor belt may be provided in the loading-side buffer mechanism BF1.

In the same manner, even the buffer mechanism BF2 may be provided with a moving mechanism which sequentially moves the unloading cassette C2 in the order of the standby position P5, the standby position P6, the standby position P8, the standby position P6, and the standby position P7. As the moving mechanism, for example, a fork member holding the engagement portions Cx of the loading cassette C1 and the unloading cassette C2 may be provided. For example, the fork member may have the same configuration as that of the cassette holding member 74 of the cassette carrying device CC.

Further, in the above-described embodiment, a configuration has been described in which the loading-side carrying device SC1 solely holds and rotates the substrate S, but the invention is not limited thereto. For example, the loading-side carrying device SC1 and the unloading-side carrying device SC2 may be disposed with the front and rear surfaces of one substrate S interposed therebetween and hold and rotate the substrate S. In this case, one of the loading-side carrying device SC1 and the unloading-side carrying device SC2 may actively rotate and the other thereof may passively rotate or both of them may actively rotate. When the front and rear surfaces of the substrate S are held by the loading-side carrying device SC1 and the unloading-side carrying device SC2, it is possible to make the environmental state such as the air stream at the side of the first surface and the second surface of the substrate S substantially the same. Further, since the substrate S may be interposed, it is possible to rotate the substrate S even when the absorption of the substrate S is released. Since the state at both surfaces of the substrate S is adjusted, it is possible to prevent a difference in quality of the coating film applied to both surfaces of the substrate S.

Further, in the above-described embodiment, a configuration has been described in which the peripheral edge portion removal mechanism EBR is disposed only at the unloading-side carrying device SC2, but the invention is not limited thereto. For example, the peripheral edge portion removal mechanism EBR may also be disposed at the loading-side carrying device SC1 (see the one-dotted chain line of FIG. 1). With such a configuration, for example, it is possible to perform the application operation and the peripheral edge portion removal operation in both the loading-side carrying device SC1 and the unloading-side carrying device SC2.

For example, the peripheral edge portion removal operation may be performed by the unloading-side carrying device SC2 while the application operation is performed by the loading-side carrying device SC1. Conversely, the application operation may be performed by the unloading-side carrying device SC2 while the peripheral edge portion removal operation is performed by the loading-side carrying device SC1. In this manner, since it is possible to perform the parallel process by allowing two substrate carrying mechanisms SC to alternately access the application mechanism CT, it is possible to perform the process efficiently and to further shorten the process tact time.

Further, as described above, when the loading-side carrying device SC1 and the unloading-side carrying device SC2 simultaneously hold and rotate one substrate S, the peripheral edge portion removal mechanism EBR may be provided inside the application mechanism CT. With such a configuration, the loading-side carrying device SC1 and the unloading-side carrying device SC2 may perform the application operation while holding and rotating the substrate S, and may perform the peripheral edge portion removal operation subsequently after the application operation. Accordingly, since it is possible to perform the application operation and the peripheral edge portion removal operation in one device, it is possible to improve the efficiency of the process. Further, since the application operation and the peripheral edge portion removal operation are performed in one application mechanism CT, for example, it is possible to load the next substrate S to be processed by the loading-side carrying device SC1 while unloading one substrate S using the unloading-side carrying device SC2 after the application operation and the peripheral edge portion removal operation for one substrate S are performed. Since it is possible to simultaneously perform the loading operation of the loading-side carrying device SC1 and the unloading operation of the unloading-side carrying device SC2, it is possible to improve the efficiency of the process.

Further, in the above-described embodiment, for example, as shown in FIG. 18, a configuration has been described in which the stage 80 and the accommodation mechanism 81 are integrated with each other and the accommodation mechanism 81 is elevated along with the elevation of the stage 80, but the invention is not limited thereto. For example, the accommodation mechanism 81 may be elevated independently from the stage 80. In this case, for example, the driving mechanism 84 may be connected to the accommodation mechanism 81, and the accommodation mechanism 81 may be separable from the stage 80.

Further, in the above-described embodiment, a configuration has been described in which the cleaning liquid nozzle 82c accesses the accommodation mechanism 81, but the invention is not limited thereto. For example, the cleaning liquid nozzle 82c may be attached to the accommodation mechanism 81 (the first plate-like portion 81a, the second plate-like portion 81b, or the like). In this case, when the stage 80 or the accommodation mechanism 81 is elevated, the cleaning liquid nozzle 82c is elevated together with the accommodation mechanism 81.

Further, in addition to the configuration of the above-described embodiment, for example, a dummy substrate holding mechanism or the like (not shown) may be provided. The dummy substrate holding mechanism holds a dummy substrate which is used to clean the cup portion CP. As the dummy substrate, for example, multiple substrates having different dimensions are used. For example, the dummy substrate holding mechanism holds the dummy substrate in an upright position. The dummy substrate may have the same dimensions as that of the substrate S or have dimensions different from those of the substrate S.

While preferred embodiments of the invention have been described and illustrated above, it should be understood that these are examples of the invention and are not to be considered as limiting. Additions, omissions, substitutions, and other modifications can be made without departing from the spirit or scope of the invention. Accordingly, the invention is not to be considered as being limited by the foregoing description, and is only limited by the scope of the appended claims.

What is claimed is:

1. A coating device comprising:
a substrate carrying unit which rotatably holds a substrate while the substrate is upright and is able to dispose the held substrate at a first position and a second position;
an application unit which includes a liquid material nozzle ejecting a liquid material to each of first and second surfaces of the substrate disposed at the first position, so as to form coating films on the first and second surfaces of the substrate; and
a removal unit comprising:
an accommodation mechanism configured to accommodate part of a peripheral edge portion of the substrate disposed at the second position, the accommodation mechanism including an end portion accommodation portion configured to accommodate a lower end portion of the substrate, the end portion accommodation portion including a nozzle insertion portion, and
a cleaning liquid ejection mechanism including a cleaning liquid nozzle and a rotatable arm, the cleaning liquid nozzle including a bent portion,
wherein the cleaning liquid ejection mechanism is configured to be rotated clockwise or counter-clockwise such that the cleaning liquid nozzle is inserted into the nozzle insertion portion, and to eject a cleaning liquid to the peripheral edge portion and remove the liquid material of the peripheral edge portion while the cleaning liquid nozzle is inserted in into the nozzle insertion portion.

2. The coating device according to claim 1, wherein the removal unit includes a suction mechanism.

3. The coating device according to claim 2, wherein the suction mechanism includes a suction port which is provided at the lower end portion of the substrate.

4. The coating device according to claim 1, wherein the cleaning liquid nozzle is configured to eject the cleaning liquid from a center of the substrate toward the peripheral edge portion of the substrate.

5. The coating device according to claim 1, wherein the cleaning liquid nozzle is formed to be bent from a center toward the peripheral edge portion.

6. The coating device according to claim 1, wherein the accommodation mechanism includes a downstream accommodation portion configured to accommodate a downstream of the lower end portion of the substrate in a rotation direction of the substrate.

7. The coating device according to claim 6, wherein the accommodation mechanism includes an upstream accommodation portion which accommodates an upstream of the lower end portion of the substrate in the rotation direction of the substrate.

8. The coating device according to claim 1, wherein the removal unit includes a driving mechanism which elevates the accommodation mechanism.

9. The coating device according to claim 1, wherein the application unit includes a cup mechanism which accommodates the substrate disposed at the first position.

* * * * *